US008853557B2

(12) United States Patent
Yugawa

(10) Patent No.: US 8,853,557 B2
(45) Date of Patent: Oct. 7, 2014

(54) WIRING BOARD AND MOUNT STRUCTURE

(75) Inventor: Hidetoshi Yugawa, Shiga (JP)

(73) Assignee: Kyocera Corporation, Kyoto (JP)

( * ) Notice: Subject to any disclaimer, the term of this patent is extended or adjusted under 35 U.S.C. 154(b) by 177 days.

(21) Appl. No.: 12/893,142

(22) Filed: Sep. 29, 2010

(65) Prior Publication Data
US 2011/0083883 A1  Apr. 14, 2011

(30) Foreign Application Priority Data

Sep. 30, 2009 (JP) ................................ 2009-227067
Feb. 23, 2010 (JP) ................................ 2010-037405
Sep. 22, 2010 (JP) ................................ 2010-212533

(51) Int. Cl.
H05K 1/03 (2006.01)
H05K 1/09 (2006.01)
H05K 3/42 (2006.01)
H05K 3/46 (2006.01)
H05K 3/38 (2006.01)

(52) U.S. Cl.
CPC .......... *H05K 3/388* (2013.01); *H05K 2203/095* (2013.01); *H05K 3/421* (2013.01); *H05K 3/4602* (2013.01); *H05K 3/381* (2013.01); *H05K 2201/0175* (2013.01); *H05K 2201/10674* (2013.01); *H05K 2201/0323* (2013.01); *H05K 3/4644* (2013.01)
USPC .......................................... 174/256; 174/260

(58) Field of Classification Search
CPC .............. H05K 2201/0175; H05K 2201/0323; H05K 2201/10674; H05K 2203/095; H05K 3/381; H05K 3/388; H05K 3/421; H05K 3/4602; H05K 3/4644
USPC .......... 174/260, 256, 261; 257/750, 751, 757, 257/717; 438/656, 643
See application file for complete search history.

(56) References Cited

U.S. PATENT DOCUMENTS

| 6,190,493 | B1 * | 2/2001 | Watanabe et al. | 156/300 |
| 6,339,020 | B1 * | 1/2002 | Weihs et al. | 438/643 |
| 7,038,318 | B2 * | 5/2006 | Iyer et al. | 257/768 |
| 7,419,903 | B2 * | 9/2008 | Haukka et al. | 438/627 |
| 2009/0315093 | A1 * | 12/2009 | Li et al. | 257/314 |
| 2011/0100691 | A1 * | 5/2011 | Yugawa | 174/260 |
| 2011/0114375 | A1 * | 5/2011 | Ohmi et al. | 174/257 |

FOREIGN PATENT DOCUMENTS

| JP | 09-023065 | | 1/1997 |
| JP | 2004130748 | A | 4/2004 |
| JP | 2004327931 | A | 11/2004 |
| JP | WO2007/132879 | * | 11/2007 |
| JP | WO2010010753 | * | 5/2009 |

OTHER PUBLICATIONS

Japanese Office Action with English Concise Explanation, Japanese Patent Appln. No. 2010-212533, Apr. 1, 2014, 3 pp.

* cited by examiner

*Primary Examiner* — Yuriy Semenenko
(74) *Attorney, Agent, or Firm* — Volpe and Koenig, P.C.

(57) ABSTRACT

A circuit board provided with a first resin layer and with a first conductive layer formed on the first resin layer. The first conductive layer has a metal carbide layer containing a carbide of a transition metal selected from Group IV, Group V, or Group VI in the Periodic Table and bonded to the first resin layer. The first resin layer has a first region to which the metal carbide layer is bonded and a second region located in an inner portion of the first resin layer from the first region. The first region has a larger ratio of number of atoms of nitrogen relative to number of atoms of carbon than in the second region.

6 Claims, 29 Drawing Sheets

FIG. 19

| | Plasma | Take-off angle of 20 deg. | | Take-off angle of 45 deg. | |
|---|---|---|---|---|---|
| | | O/C atomic ratio | N/C atomic ratio | O/C atomic ratio | N/C atomic ratio |
| EXAMPLES | Ar plasma | 0.379 (+0.193) | 0.075 (-0.002) | 0.343 (+0.147) | 0.077 (-0.014) |
| | O₂ plasma | 0.332 (+0.146) | 0.071 (-0.006) | 0.313 (+0.117) | 0.080 (-0.003) |
| | N₂ plasma | 0.398 (+0.212) | 0.126 (+0.049) | 0.356 (+0.160) | 0.119 (+0.036) |
| | None | 0.186 | 0.077 | 0.196 | 0.083 |
| COMPARATIVE EXAMPLES | None | 0.182 (+0.004) | 0.091 (-0.014) | 0.182 (+0.014) | 0.091 (-0.008) |

FIG. 25

| Samples | Take-off angle(deg) | Atomic ratio | |
|---|---|---|---|
| | | O/C | N/C |
| Calculating | − | 0.217 | 0.13 |
| Pristine | 20 | 0.172 | 0.107 |
| | 45 | 0.186 | 0.114 |
| Ar plasma | 20 | 0.368 | 0.094 |
| | 45 | 0.338 | 0.099 |
| NiCr Sputtering | 20 | 0.65 | 0.059 |
| | 45 | 0.53 | 0.072 |

FIG. 27

|  | Take-off angle(deg) | ev | | |
| --- | --- | --- | --- | --- |
|  |  | Ni2p3/2 | Cr2p3/2 | DIFFERENCE |
| SILICON (COMPARATIVE EXAMPLES) | 20 | 856.2 | 577.2 | 279.0 |
|  | 45 | 856.2 | 577.2 | 279.0 |
| RESIN (EXAMPLES) | 20 | 856.1 | 576.8 | 279.3 |
|  | 45 | 856.1 | 576.8 | 279.3 |

FIG. 28

| Samples | Take-off angle of 20 deg .(depth:5nm) | |
| --- | --- | --- |
| | O/C atomic ratio | N/C atomic ratio |
| Calculating | 0.217 | 0.130 |
| Pristine(P) | 0.172 | 0.107 |
| Ar plasma+atmosphere +NiCr sputtering(Ar) | 0.650 (Ar/P : 378%) | 0.059 (Ar/P : 55%) |
| $N_2$ plasma +NiCr sputtering($N_2$) | 0.816 ($N_2$/P : 474%) | 0.194 ($N_2$/P : 181%) |

WIRING BOARD AND MOUNT STRUCTURE

TECHNICAL FIELD

The present invention relates to a circuit board used in electronic apparatuses and to a circuit assembly comprising such a circuit board on which electronic components are mounted. Such electronic apparatuses include various types of audio/visual apparatuses, home electronics, communication devices, computer devices and their peripherals, and so on.

BACKGROUND ART circuit boards on which electronic components are to be mounted have been known in the past. Such electronic components include semiconductor devices or capacitors etc. Such semiconductor devices include ICs (integrated circuits) or LSI (large scale integrated circuits) etc.

As such a circuit board, a board which has a resin layer (insulating layer) containing a resin and a conductive layer formed on the resin layer and containing a metal is known (for example, Patent Document 1: Japanese Patent Publication (A) No. 9-23065).

In order to increase a bonding strength between the resin layer and the conductive layer, the practice has been to roughen the surface of the resin layer. However, roughening is not preferred from the viewpoint of maintaining good electrical characteristics of the circuit board. In particular, when wiring lines formed by the conductive layer are miniaturized, the roughening has a larger effect causing a drop in electrical characteristics. Accordingly, increasing the bonding strength by a method other than roughening is desired.

CITATION LIST

Patent Document

Patent Document 1: Japanese Patent Publication (A) No. 9-23065

SUMMARY OF INVENTION

A circuit board of a first aspect of the present invention is provided with a resin layer and a conductive layer which is formed on the resin layer, wherein the conductive layer has a metal carbide layer which contains a carbide of a transition metal selected from Group IV, Group V, or Group VI in the Periodic Table and which is bonded to the resin layer, the resin layer has a first region to which the metal carbide layer is bonded and a second region located at an inside of the resin layer from the first region, and the first region has a larger ratio of number of nitrogen atoms to number of carbon atoms than the second region.

A circuit board of a second aspect of the present invention is provided with a resin layer and a conductive layer which is formed on the resin layer, wherein the conductive layer has a metal carbide layer which contains a carbide of a transition metal selected from Group IV, Group V, or Group VI in the Periodic Table and which is bonded to the resin layer, the resin layer has a first region to which the metal carbide layer is bonded and a second region located at an inside of the resin layer from the first region, and the first region has a larger ratio of number of oxygen atoms to number of carbon atoms than the second region.

A circuit assembly of a third aspect of the present invention is provided with the above circuit board and an electronic component which is mounted on the circuit board and which is electrically connected to the conductive layer.

According to the above configuration, the bonding strength between the resin layer and the conductive layer can be increased.

BRIEF DESCRIPTION OF DRAWINGS

FIG. 19 A view showing analysis results relating to the ratios of numbers of atoms of resin layers of embodiments of the present invention.

FIG. 25 Another view showing analysis results relating to the ratios of numbers of atoms of resin layers of embodiments of the present invention.

FIG. 27 Analysis results showing influences of a board exerted upon the metal layer.

FIG. 28 Still another view showing analysis results relating to the ratios of numbers of atoms of resin layers of embodiments of the present invention.

Figure 1:
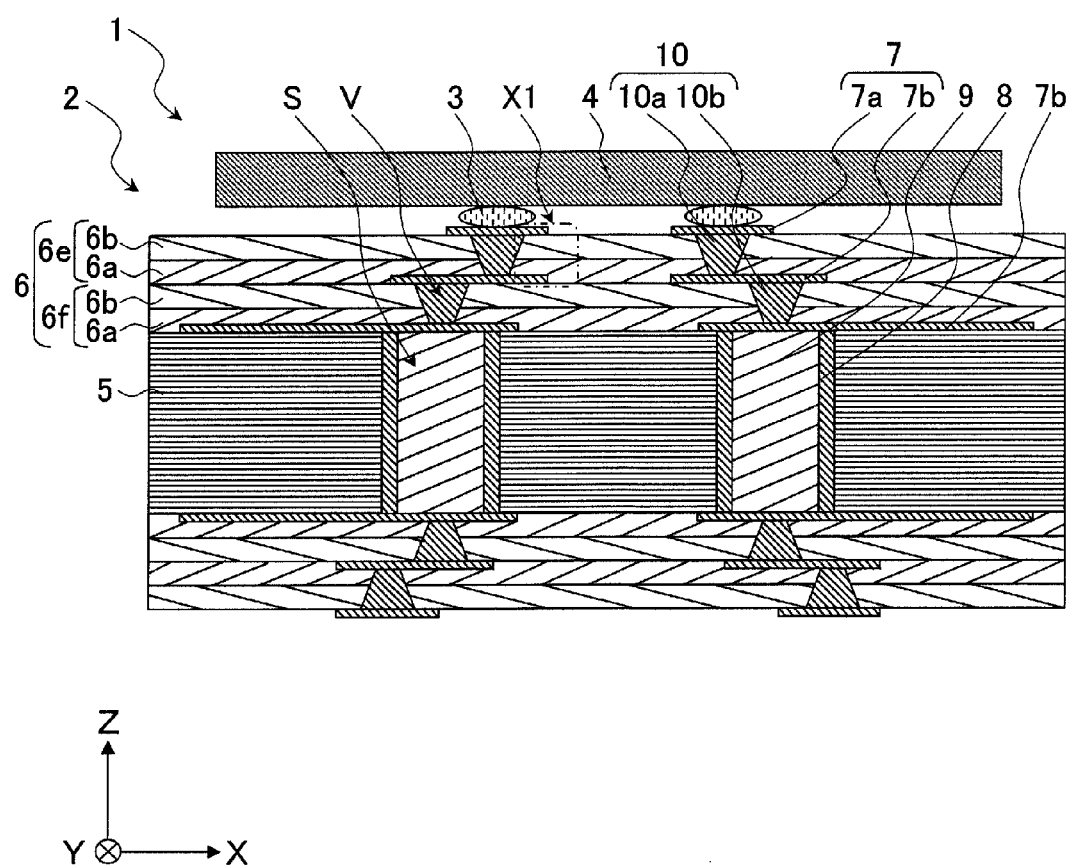
FIG. 1 A cross-sectional view of a circuit assembly according to an embodiment of the present invention.

REFERENCE SIGNS LIST 1 circuit assembly
2 circuit board
3 bump
4 electronic component
5 substrate
6 insulating layer
6a bonding layer
6b high heat resistance resin layer
6ej first region
6ek second region
7 conductive layer
7a first conductive layer
7ax metal carbide layer
7ay first metal layer
7az second metal layer
7b second conductive layer
7w conductive material layer
8 thru hole conductor
9 insulator
10 via conductor
S thru hole
V via hole

EMBODIMENTS OF INVENTION

Constitutions of Circuit Board and Circuit Assembly

Below, a circuit assembly including a circuit board according to an embodiment of the present invention will be explained in detail based on FIG. 1 and FIG. 2.

A circuit assembly 1 shown in FIG. 1 is constituted by including a circuit board 2 and an electronic component 4 which is flip-chip mounted on the top surface of the circuit board 2 through bumps 3.

The circuit board 2 is constituted by including a substrate 5, a plurality of insulating layers 6 which are stacked on the top surface and bottom surface of the substrate 6, and a plurality of conductor layers 7 which are arranged on the top surfaces and bottom surfaces of the insulating layers 6.

The substrate 5 is, for example, comprised of a thermosetting resin in which a base material is provided. As the base material, for example, a woven fabric formed by vertically and horizontally weaving glass fibers, poly-para-phenylene benzobisoxazole resin fibers, wholly aromatic polyamide resin fibers, etc. may be used. As the thermosetting resin, for example, an epoxy resin, bismaleimide triazine resin, cyanate resin, etc. may be used. Further, the substrate 5 may have a structure not using a base material, for example, a structure comprised of a low thermal expansion resin as well. By using a low thermal expansion resin for the substrate 5, the thermal expansion of the substrate 5 itself is reduced and can be made to approach the thermal expansion of the electronic component 4, so breakage of the electronic component 4 can be effectively prevented. As the low thermal expansion resin, for example, a poly-para-phenylene benzobisoxazole resin, wholly aromatic polyamide resin, wholly aromatic polyester resin, polyimide resin, liquid crystal polymer resin, etc. may be used. Note that, "thermal expansion coefficient" means the linear expansion ratio measured by a test method according to ISO11359-2: 1999.

Further, the substrate 5 is formed with thru holes S running through it in an up/down direction (Z-direction). A thru hole conductor 8 is formed on an inner wall of each thru hole S. The thru hole conductor 8 electrically connects conductor layers 7 which are formed at the top surface and bottom surface of the substrate 5 to each other. The thru hole conductor 8 is made of a conductive material. The conductive material includes, for example, copper, silver, nickel, chromium, etc. In the present embodiment, the thru hole conductor 8 is formed in a cylindrical shape, and an insulator 9 is filled inside the cylinder in order to secure the flatness of the substrate 5. Note that, the insulator 9 includes a resin material, filler, elastomer, fire retardant, curing agent, etc. As the resin material, for example, an epoxy resin, cyanate resin, etc. is used Each insulating layer 6 has a bonding layer 6a and a high heat resistance resin layer 6b.

Each bonding layer 6a bonds high heat resistance resin layers 6b to each other or a high heat resistance resin layer 6b and the substrate 5. The bonding layer 6a contains a thermosetting resin, thermoplastic resin, etc. As the thermosetting resin, for example, a polyimide resin, acrylic resin, epoxy resin, urethane resin, cyanate resin, silicone resin, bismaleimide triazine resin, etc. may be used. Further, as the thermoplastic resin, for example, a liquid crystal polymer etc. may be used. Note that, the thermal expansion coefficient of the bonding layer 6a is preferably set to, for example, 15 ppm/° C. to 80 ppm/° C. Further, the bonding layer 6a is preferably set so that the thickness becomes for example 2 μm to 20 μm.

Each high heat resistance resin layer 6b is preferably not provided with a base material, but contains a high heat resistance resin. The high heat resistance resin does not have a clear glass transition temperature or melting point and has a high thermal decomposition temperature. The thermal decomposition temperature of the resin is preferably set to 350° C. or more, more preferably is set to 400° C. or more. As a result, softening and deterioration of the resin at the time when heat is applied to the circuit board 2 can be reduced. As a resin having such characteristics, for example, a polyimide resin, polybenzoxazole resin, polyimide benzoxazole resin, etc. may be used. Further, among the above materials, a polyimide benzoxazole resin is preferably used. A polyimide benzoxazole resin has a small thermal expansion coefficient of 5 ppm/° C. or less. As a result, the difference of thermal expansion between the circuit board 2 and the electronic component 4 is reduced, and stress applied to the conductor layers 7 can be reduced. Note that, the thickness of the high heat resistance resin layer 6b is preferably set to for example 2 μm to 20 μm. Further, the thermal decomposition temperature is the temperature at which the mass of the resin is reduced by 5% in thermogravimetry according to ISO11358: 1997.

Each insulating layer 6 is formed with via holes V, while inside each via hole V, a via conductor 10 is formed. Each via conductor 10 electrically connects the conductor layers 7 arranged at the top surface and bottom surface of an insulating layer 6 to each other. Further, the via conductor 10 is formed so that, for example, an area of a cross-section parallel to the circuit board 2 becomes larger from the top surface of the substrate 5 toward the top surface of the circuit board 2 or from the bottom surface of the substrate 5 toward the bottom surface of the circuit board 2. Note that, the via conductor 10 is formed by a conductive material. The conductive material includes, for example, copper, silver, gold, aluminum, nickel, chromium, etc. Further, the thermal expansion coefficient of the via conductor 10 is preferably set to for example 12 ppm/° C. to 20 ppm/° C.

Each conductor layer 7 is electrically connected to the electronic component 4 and has a function as a signal line which transmits an electric signal supplied from the electronic component 4 or an electric signal supplied to the electronic component 4 or has a function as a power supply line which supplies power to the electronic component 4. Conductor layers 7 are formed at the top surface and bottom surface of the substrate 5 and are electrically connected to the thru hole conductors 8. Further, conductor layers 7 are formed at top surfaces and bottom surfaces of the insulating layers 6 and are electrically connected to the via conductors 10. Note that, the thermal expansion coefficient of the conductor layer 7 is preferably set to, for example, 12 ppm/° C. to 20 ppm/° C.

The electronic component 4 is electrically connected through bumps 3 to the conductor layers 7. As the material of the bumps 3, a conductive material is used. The conductive material includes, for example, copper, silver, zinc, tin, indium, bismuth, antimony, etc. As the electronic component 4, a semiconductor device, capacitor, etc. may be used. As a semiconductor device, for example, an IC, LSI, etc. may be used. As the material of the semiconductor device, silicon, germanium, gallium arsenide, gallium arsenic phosphide, gallium nitride, silicon carbide, etc. may be used. Further, the thickness dimension of the electronic component 4 is for example 0.1 mm to 1 mm.

Next, the constitutions of the conductor layers 7 and insulating layers 6 (high heat resistance resin layers 6b) will be explained in more detail.

Figure 2:
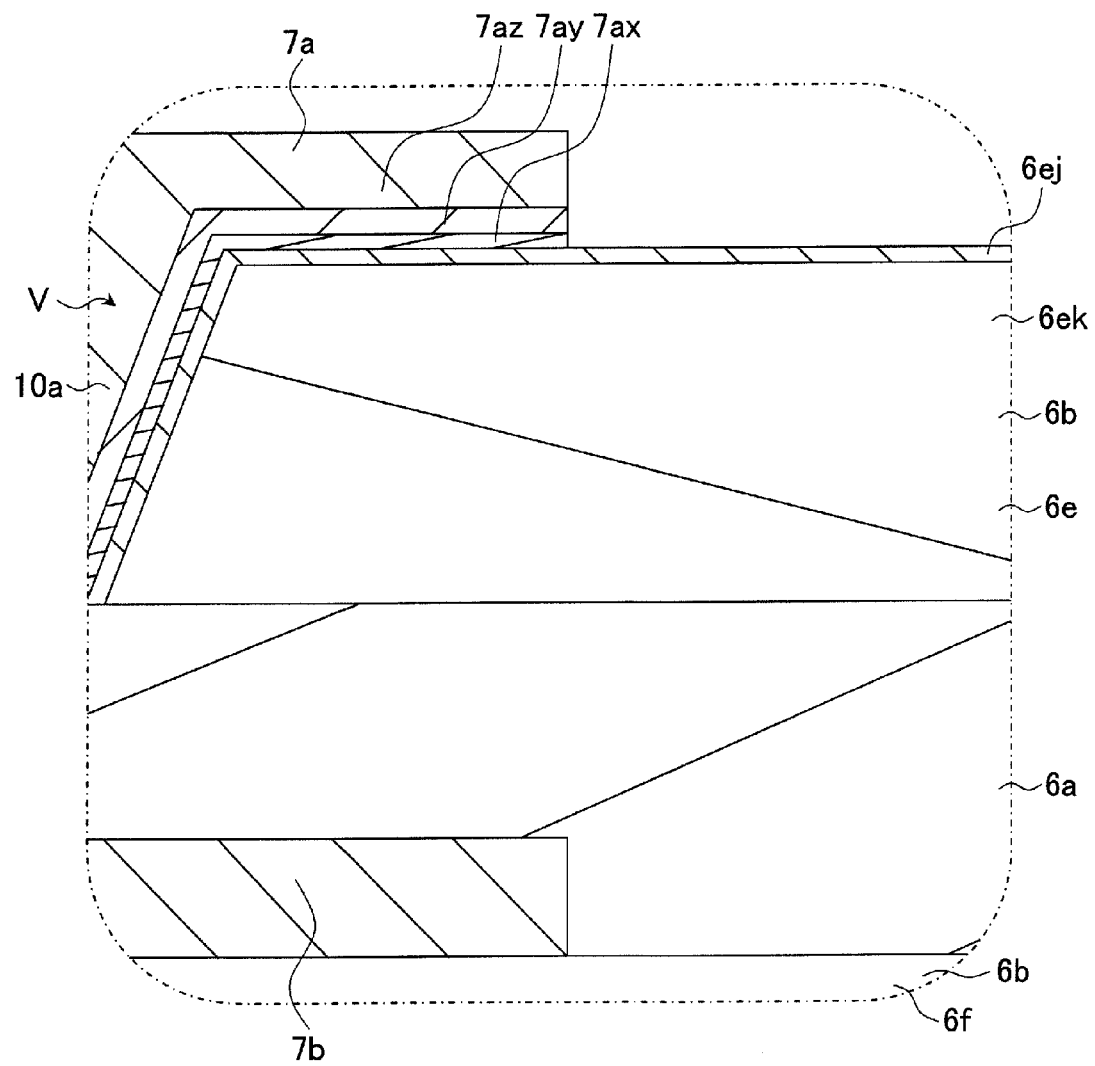
FIG. 2 An enlarged view of an X1 portion of the circuit assembly shown in FIG. 1.

As shown in FIG. 2, each conductor layer 7 has a first conductive layer 7a which is formed on the uppermost layer (first resin layer 6e) of the insulating layers 6 and a second conductive layer 7b which is formed on another insulating layer 6 (second resin layer 6f).

The first conductive layer 7a has a metal carbide layer 7ax bonded to the high heat resistance resin layer 6b of the first resin layer 6e, a first metal layer 7ay bonded to the metal carbide layer 7ax, and a second metal layer 7az bonded to the first metal layer 7ay.

The metal carbide layer 7ax contains a carbide of a first metal. The first metal need only be a metal capable of forming a carbide. As such a metal, generally, there can be mentioned a transition metal of the Group IV, Group V, or Group VI of the Periodic Table. Such a metal of the Group IV, Group V, or Group VI in the Periodic Table is for example titanium, vanadium, chromium, zirconium, niobium, tantalum, tungsten, or molybdenum. The metal carbide layer 7ax contains the carbide of the first metal, therefore can be strongly bonded with the high heat resistance resin layer 6b. The reason for this is guessed to be the formation of the carbide of the first metal by a chemical bond of the first metal and a portion of the molecular chain of the resin contained in the high heat resistance resin layer 6b. Further, since the high heat resistance resin layer 6b contains the high heat resistance resin explained above, it is guessed that softening and deterioration of the resin when heat is applied to the circuit board 2 are reduced and therefore the possibility of cleavage of bonds of the first metal and the portion of the molecular chain of the resin can be reduced.

The metal carbide layer 7ax may contain a carbide of nickel-chromium alloy as the carbide of the first metal as well.

In this case, the first metal is chromium. It is guessed that the chromium forms a carbide in the nickel-chromium alloy. Further, in the metal carbide layer 7ax, preferably the content of the carbide of the first metal is set to 1% to 30%. Further, the thickness of the metal carbide layer 7ax is preferably set to 2 nm to 50 nm.

The first metal layer 7ay contains, as its principal ingredient, the first metal, that is, the same metal material as the first metal contained in the metal carbide layer 7ax. The conductivity is higher than the metal carbide layer 7ax, therefore the thickness of the first metal layer 7ay is preferably larger than the thickness of the metal carbide layer 7ax. Further, since the first metal layer 7ay and the metal carbide layer 7ax contain the first metal as the same metal material, by the first metal contained in the first metal layer 7ay bonding with the carbide of the first metal contained in the metal carbide layer 7ax, the first metal layer 7ay can be strongly bonded with the metal carbide layer 7ax.

Further, when the metal carbide layer 7ax contains a carbide of nickel-chromium alloy as the carbide of the first metal, the first metal layer 7ay preferably contains a nickel-chromium alloy. Further, in the first metal layer 7ay, the content of the first metal is preferably set to 70% to 99%. Further, the thickness of the first metal layer 7ay is preferably set to 5 nm to 100 nm.

The second metal layer 7az contains a second metal which is different from the first metal. As the second metal, preferably a metal having a high conductivity is used from the viewpoint of raising the conductivity of the entire first conductive layer 7a. Further, the second metal is preferably a metal which forms an intermetallic compound with the metal contained in the first metal layer 7ay. In this case, by forming an intermetallic compound by the second metal with the metal contained in the first metal layer 7ay, the second metal layer 7az can be strongly bonded with the first metal layer 7ay.

As the second metal, copper, gold, silver, platinum, aluminum, etc. may be used. Further, when the first metal layer 7ay contains a nickel-chromium alloy, copper is preferably used as the second metal. Further, in the second metal layer 7az, the content of the second metal is preferably set to 99% or more. Further, the thickness of the second metal layer 7az is preferably set to 300 nm to 30 μm.

The high heat resistance resin layer 6b of the first resin layer 6e has a first region 6ej to which the metal carbide layer 7ax is bonded and a second region 6ek located in an inner portion of the first resin layer 6e from the first region 6ej.

The first region 6ej becomes a region in which the ratio of the number of atoms of a predetermined element relative to the number of atoms of carbon (C) is larger than that in the second region 6ek. The predetermined element is oxygen (O), nitrogen (N), or both.

Namely, the first resin layer 6e is any of the following three aspects.

First Aspect:

In the first region 6ej, the ratio of the number of atoms of oxygen relative to the number of atoms of carbon (sometimes abbreviated as "O/C") is larger than that in the second region 6ek.

Second Aspect:

In the first region 6ej, the ratio of the number of atoms of nitrogen relative to the number of atoms of carbon (sometimes abbreviated as "N/C") is larger than that in the second region 6ek.

Third Aspect:

In the first region 6ej, both of O/C and N/C are larger than those of the second region 6ek.

As explained above, by the resin molecules of the first resin layer 6e and metal atoms of the first conductive layer 7a chemically bonding through the metal carbide layer 7ax (carbide formation), the bonding strength (peel strength) of the first resin layer 6e and first conductive layer 7a is improved. Here, in the first region 6ej, due to an increase of the amount of oxygen substituents or nitrogen substituents in the resin molecule, the effect of improvement of the bonding strength due to the formation of the carbide rises. The reason for this is guessed to be the chemical bonding of functional groups such as carbonyl groups or the like with metal such as chromium, titanium, or the like simultaneously with the formation of the carbide.

In the first aspect or third aspect, that is, in an aspect where the O/C in the first region 6ej is larger, the first region 6ej may be larger than the second region 6ek in the ratio of the number of atoms of carbon contained in the carbonyl groups (—C(=O)—) relative to the number of all atoms of carbon as well. As the method for making the O/C large, the method of increasing the carbonyl groups is simple and convenient. Further, an improvement of the bonding strength due to coupling of the carbonyl groups and the first metal may be expected as well.

Note that, the concept of the first region 6ej and the second region 6ek is for convenience in order to explain the fact that the ratio of the number of atoms of oxygen etc. has become higher on the surface side which is bonded to the first conductive layer 7a than that on the inner portion side of the first resin layer 6e. Accordingly, the ratio of the number of atoms of oxygen etc. does not have to abruptly change in value or abruptly change in a ratio of change at the boundary between the first region 6ej and the second region 6ek or the like, but may gradually change from the first region 6ej to the second region 6ek as well. The boundary between the first region 6ej and the second region 6ek is not necessarily clearly specified or set either.

The thickness of the first region 6ej may be set to, for example, 0.05% to 1.0% of the thickness of the first resin layer 6e. In this case, it is guessed that a ratio of the thickness which is too thin for influencing the bonding strength being specified as the ratio in the first region 6ej or the ratio on the inner portion side of the first resin layer 6e which does not influence the bonding strength being reflected in the ratio of the first region 6ej are avoided. Further, 0.05% of the thickness of the first resin layer 6e is, for example, 2 nm to 20 nm if the thickness of the first resin layer 6e is 4 μm to 40 μm. This range is within a range where the ratio of the number of atoms can be found by an X-ray photoelectron spectroscopy (XPS).

As explained above, as the first metal contained in the metal carbide layer 7ax, a transition metal selected from the Group IV, Group V, or Group VI in the Periodic Table may be appropriately used. Further, with respect to these various first metals, any of the first resin layers 6e in the first to third aspects may be combined as well. Note, when titanium is selected as the first metal, the first resin layer 6e is preferably selected to the aspect in which N/C in the first region 6ej is large (second and third aspects). As will be shown in the embodiments explained later, when titanium is selected as the first metal, it is easier to raise the bonding strength in an aspect where N/C is large than an aspect where O/C is large (first aspect).

Note that, when titanium is selected as the first metal, since titanium easily forms an oxide, ion migration to the internal portion of the first resin layer 6e by the first conductive layer 7a is suppressed, and an insulation property between the first conductive layer 7a and the second conductive layer 7b is improved.

The second conductive layer 7b does not have a metal carbide layer. The second conductive layer 7b is preferably comprised of a metal which is easily formed and has a high conductivity. As such a metal, copper, gold, silver, aluminum, etc. may be used. Note that, the thickness of the second conductive layer may be set to 300 nm to 30 μm.

The high heat resistance resin layer 6b of the second resin layer 6f is formed so that the O/C and N/C become uniform in the thickness direction. In other words, in the second resin layer 6f, the region bonded to the second conductive layer 7b is not formed so that the O/C and N/C become larger compared with the region located in the inner portion from this region. The O/C and N/C of the high heat resistance resin layer 6b of the second resin layer 6f are equivalent to for example the O/C and N/C of the second region 6ek of the first resin layer 6e.

Accordingly, only the uppermost layer (first resin layer 6e) of the insulating layers 6 has the first region 6ej, and only uppermost layer (first conductive layer 7a) of the conductor layers 7 has the metal carbide layer 7ax. The uppermost layers of the insulating layers 6 and conductor layers 7 are portions at which stress is apt to concentrate due to the mounting of the electronic component, so the durability of the circuit board 2 is efficiently improved by improving the bonding strength at these portions.

The surface of the first resin layer 6e which is bonded with the metal carbide layer 7ax is smaller in surface roughness (for example arithmetic mean roughness) than the surface of the second resin layer 6f which is bonded with the second conductive layer 7b. Accordingly, in the second conductive layer 7b, a bonding strength by an anchor effect is obtained while a finer wiring lines are made possible at the first conductive layer 7a and an increased number of pins etc. of the electronic component 4 can be coped with. Note that, the surface of the first resin layer 6e to which the metal carbide layer 7ax is bonded is preferably set in arithmetic mean roughness to 1 nm to 50 nm. Further, the surface of the second resin layer 6f to which the second conductive layer 7b is bonded is preferably set in arithmetic mean roughness to 100 nm to 30 μm by for example roughening using a solution of potassium permanganate or the like. Further, the arithmetic mean roughness is measured according to ISO4287:1997.

Note that, each via conductor 10 may have a first via conductor 10a formed in the first resin layer 6e and a second via conductor 10b formed in the second resin layer 6f in the same way as the conductive layers 7. The first via conductor 10a may have a metal carbide layer 7ax bonded to the inner wall of the via hole V, a first metal layer 7ay bonded to the metal carbide layer 7ax, and a second metal layer 7az bonded to the first metal layer 7ay. The first resin layer 6e may have a first region 6ej bonded to the first via conductor 10a and a second region 6ek on the inner portion side than the first region 6ej. By formation in this way, the inner wall of the via hole V and the via conductor 10 can be strongly bonded. Further, the second via conductor 10b is preferably made of a metal which is easily formed and has a high conductivity. As such metal, copper, gold, silver, aluminum, etc. may be used.

Method of Production of Circuit Board and Circuit Assembly

Next, a method of production of a circuit assembly 1 including a circuit board 2 explained above will be explained based on FIG. 3 to FIG. 15.

Figure 3A:
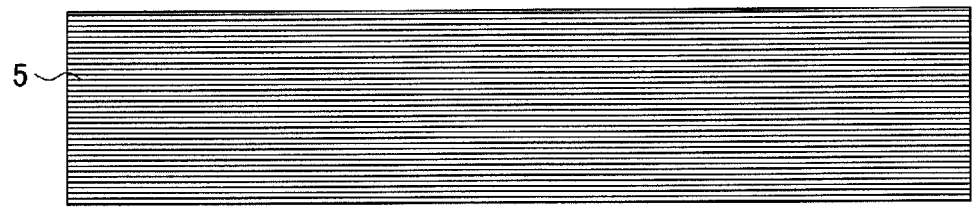
FIG. 3A, FIG. 3B, and FIG. 3C are cross-sectional views explaining a production step of the circuit assembly shown in FIG. 1.

(1) As shown in FIG. 3A, the substrate 5 is prepared. Specifically, first, a plurality of resin sheets obtained by impregnating a base material with a thermosetting resin are prepared, then those resin sheets are stacked and hot pressed to thereby prepare the substrate 5. Note that, the thickness of the substrate 5 is preferably set to 0.3 mm to 1.5 mm.

Figure 3B:
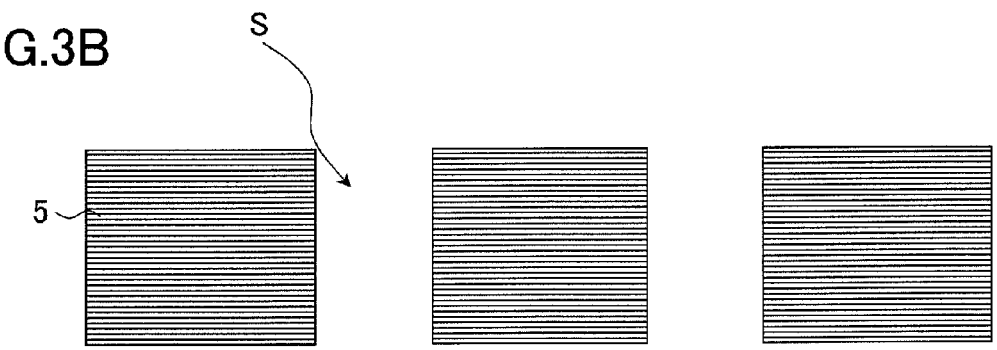

(2) As shown in FIG. 3B, in the substrate 5, thru holes S running in the up/down direction are formed. The thru holes S are formed by for example drilling or lasering. Preferably, a plurality of thru holes S are formed. Further, the widths of the thru holes S are preferably set to, for example, 0.1 mm to 1 mm.

Figure 3C:
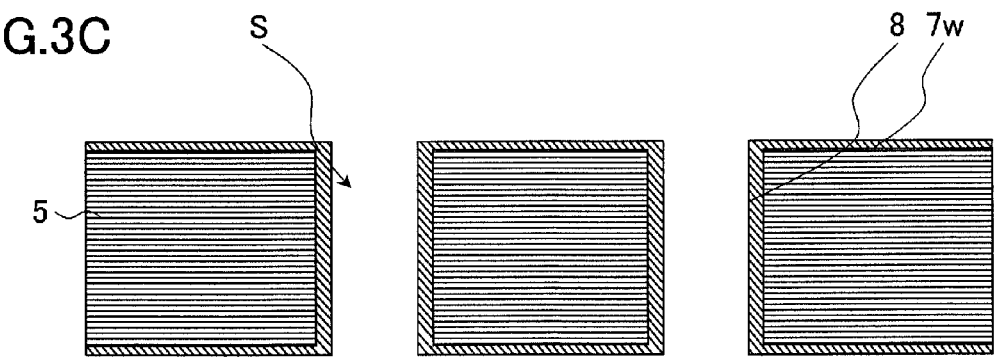

(3) As shown in FIG. 3C, a conductive material is coated on the surface of the substrate 5 to form a conductive material layer 7w. The conductive material layer 7w forms cylindrical thru hole conductors 8 at the inner wall surfaces of the thru holes S. Such a conductive material layer 7w is formed by for example electroless plating.

Figure 4A:
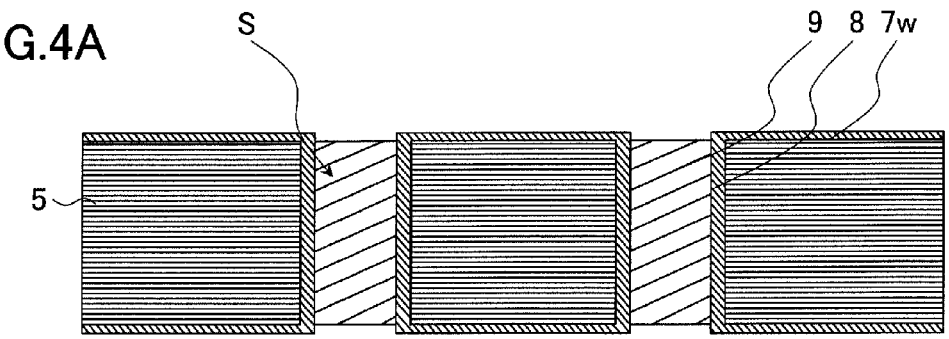
FIG. 4A, FIG. 4B, and FIG. 4C are cross-sectional views explaining a production step of the circuit assembly shown in FIG. 1.

(4) As shown in FIG. 4A, in the inner portions of the cylindrical thru hole conductors 8, a resin material etc. are filled to form insulators 9.

Figure 4B:
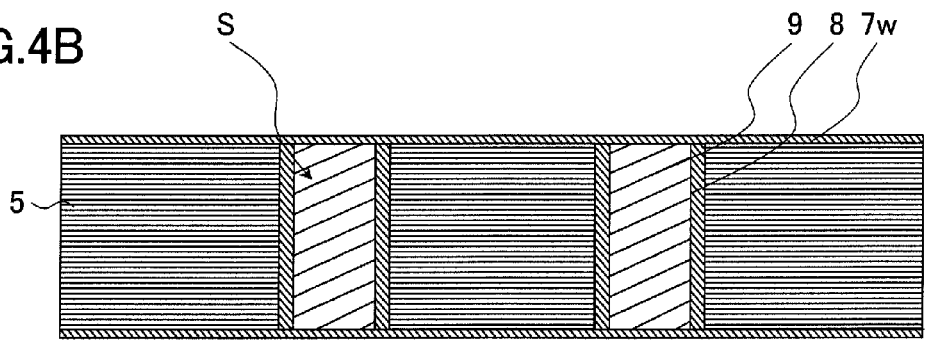

(5) As shown in FIG. 4B, a conductive material is coated on exposed portions of the insulators 9 to form the conductive material layer 7w at the exposed portions of the insulators 9. Such a conductive material is coated by for example electroless plating.

Figure 4C:
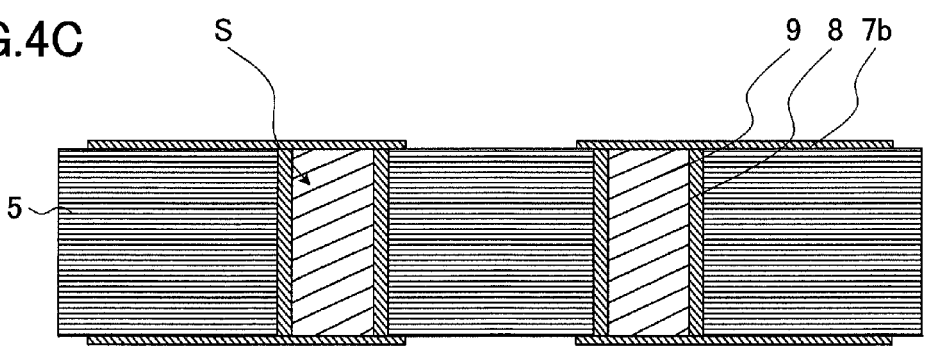

(6) As shown in FIG. 4C, the conductive material layer 7w is patterned to thereby form the second conductive layer 7b. The conductive material layer 7w is patterned by using the conventionally known photolithography, etching, or the like.

Figure 5A:
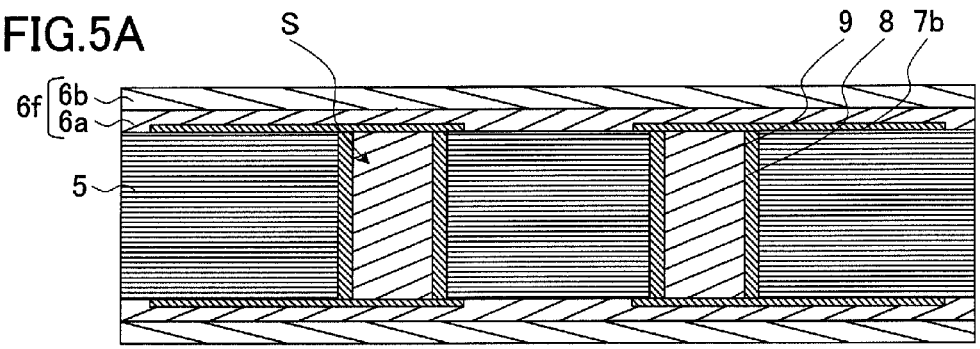
FIG. 5A, FIG. 5B, and FIG. 5C are cross-sectional views explaining a production step of the circuit assembly shown in FIG. 1.

(7) As shown in FIG. 5A, on the second conductive layer 7b, the high heat resistance resin layer 6b is adhered through the bonding layer 6a. Adhesion is carried out by hot pressing. The hot pressing is carried out by using, for example, a hot press machine. The second resin layer 6f comprised of the bonding layer 6a and the high heat resistance resin layer 6b can be formed in this way.

Figure 5B:
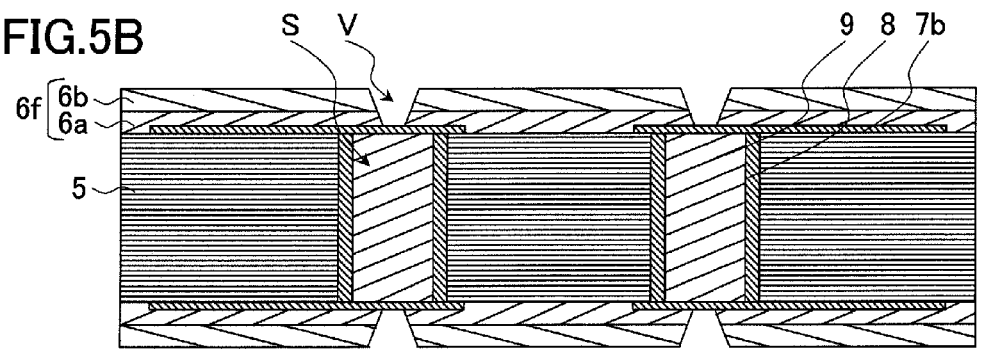

(8) As shown in FIG. 5B, via holes V are formed in the second resin layer 6f. At least a portion of the second conductive layer 7b is exposed in the via holes V. For the formation of the via holes V, use is made of, for example, a YAG laser or a CO$_2$ laser. The via holes V are formed by firing a laser beam at the top surface of the high heat resistance resin layer 6b from the vertical direction. Note that, the via holes V can be formed so as to become narrower in opening width from the top surface of the high heat resistance resin layer 6b toward the top surface of the substrate 5 by adjusting the output of the laser beam.

Figure 5C:
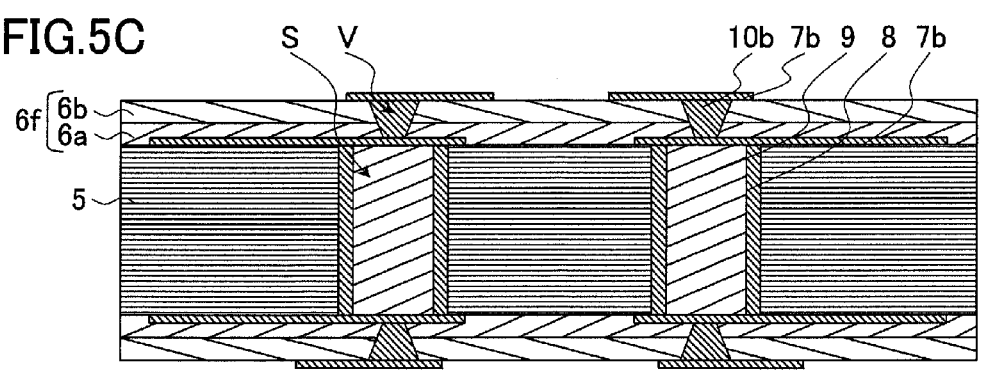

(9) As shown in FIG. 5C, second via conductors 10b are formed in the via holes V, and the second conductive layer 7b is formed on the top surface of the second resin layer 6f. The second via conductors 10b and second conductive layer 7b are formed using electroless plating etc. by a semi-additive method, subtractive method, full additive method, etc. Among these, the semi-additive method is preferably used for formation. Note that, the surface of the second resin layer 6f may be roughened before the formation of the second conductive layer 7b by using chemical solution such as permanganate or the like.

Figure 6A:
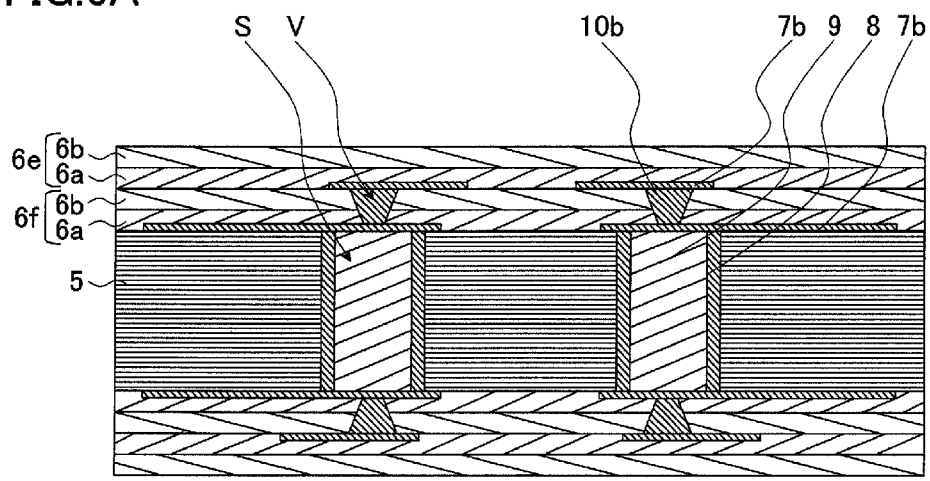
FIG. 6A and FIG. 6B are cross-sectional views explaining a production step of the circuit assembly shown in FIG. 1.

(10) As shown in FIG. 6A, on the second conductive layer 7b, the high heat resistance resin layer 6b is adhered through the bonding layer 6a to form the first resin layer 6e which becomes the uppermost layer in the circuit board 2. Adhesion is carried out in the same way as the step of (7) explained above.

Figure 6B:
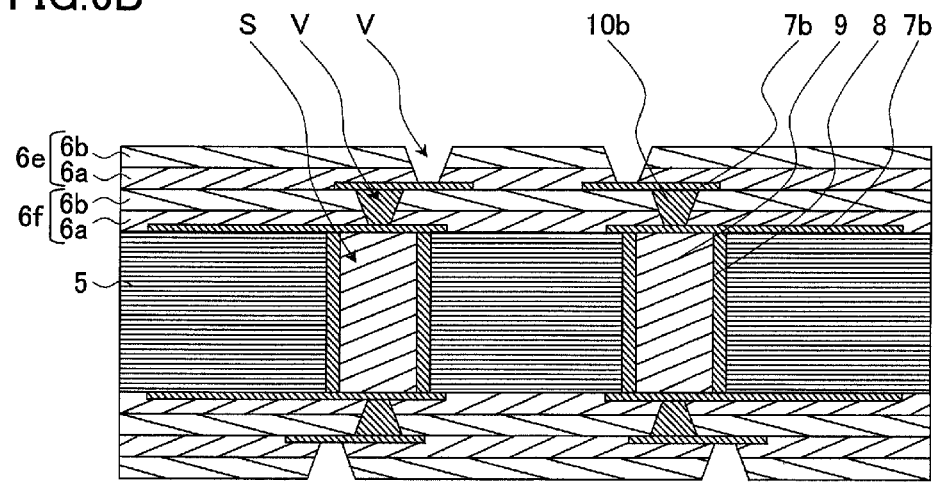

(11) As shown in FIG. 6B, via holes V are formed in the first resin layer 6e. The via holes V are formed in the same way as the step of (8) explained above.

Figure 7:
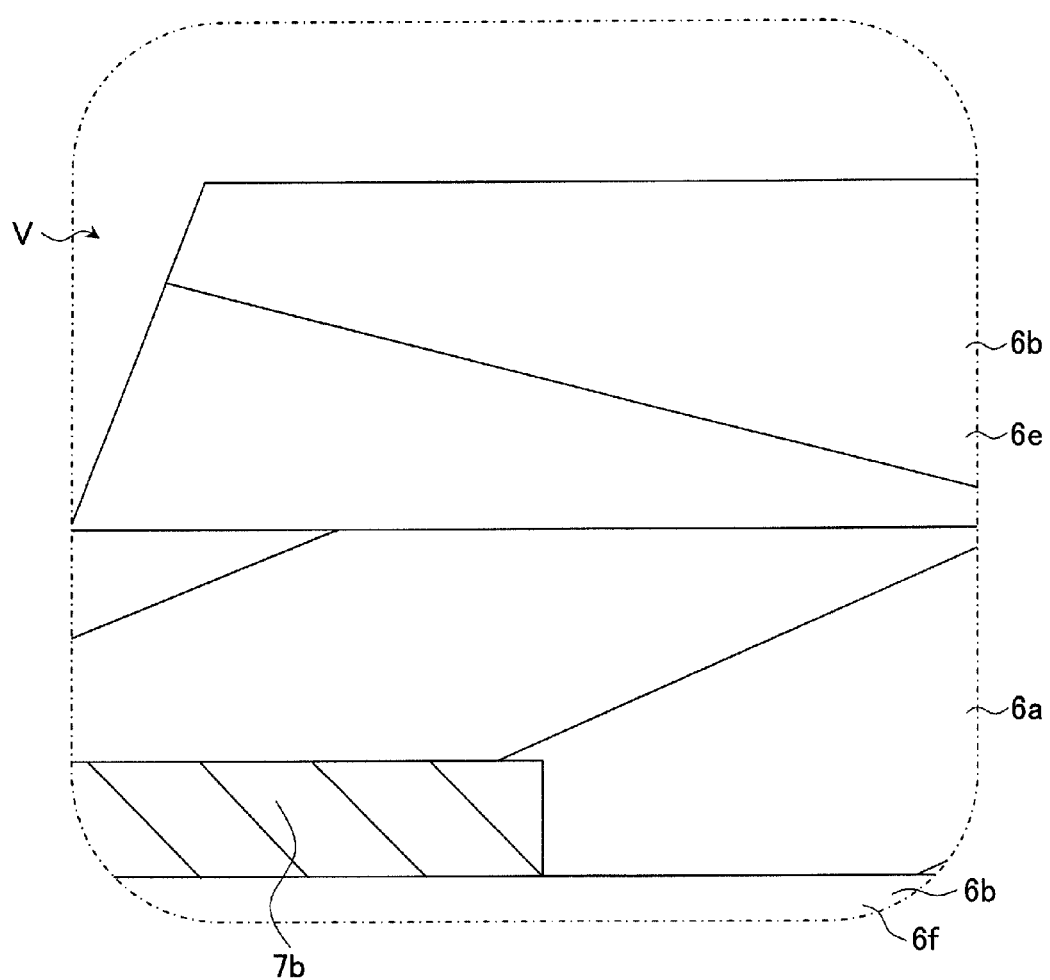
FIG. 7 An enlarged view explaining a production step in an X1 portion of the circuit assembly shown in FIG. 1.
Figure 8:
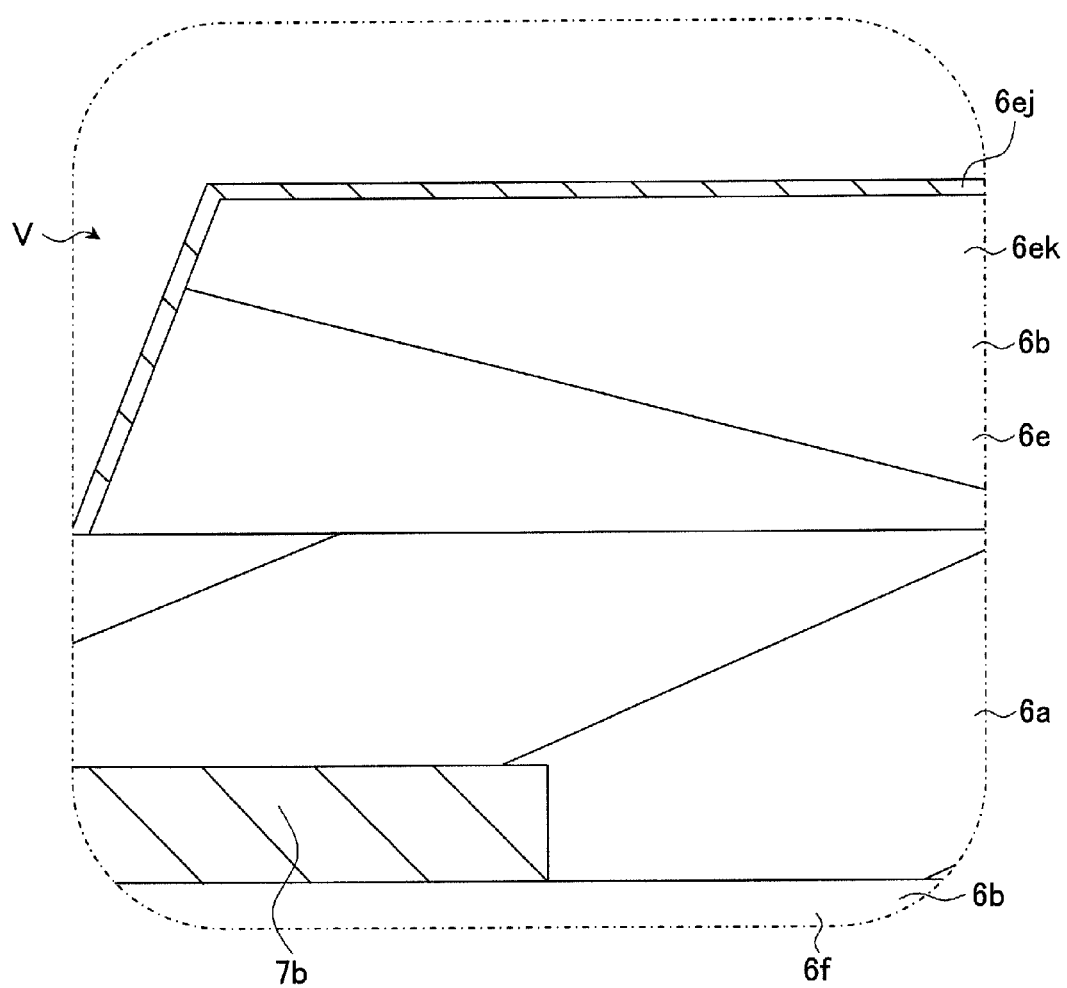
FIG. 8 An enlarged view explaining a production step in an X1 portion of the circuit assembly shown in FIG. 1.

(12) As shown in FIG. 7 and FIG. 8, at least one of O/C and N/C in the first region 6ej is made larger. As such a method, the following two methods can be mentioned.

First Method:
Plasma treatment is carried out, then the circuit board 2 is exposed to the ambient air.

Second Method:
Plasma treatment by a specific plasma is carried out (after the plasma treatment, the circuit board 2 is not exposed to the ambient air).

In the first method, by the plasma treatment, the first resin layer 6e becomes a radical state. Then, by exposing the first resin layer 6e to the ambient air, oxygen functional groups are formed on the surface of the first resin layer 6e. Namely, a first region 6ej in which the ratio of O/C is relatively high is formed.

In the plasma treatment in the first method, when nitrogen plasma is used, nitrogen functional groups are formed on the surface of the first resin layer 6e as well. Namely, a first region 6ej in which the ratio of N/C is relatively high is formed.

Note that, as understood from the above explanation, in the first method, if plasma other than nitrogen plasma such as argon (Ar) plasma is used, a first region 6ej of the first aspect (where the ratio of O/C is high) is formed. Further, if nitrogen plasma is used, a first region 6ej of the third aspect (where ratios of O/C and N/C are high) is formed.

Further, in the first method, after the circuit board 2 is exposed to the ambient air, plasma treatment may be further carried out.

In the second method, nitrogen plasma or oxygen plasma is used.

When nitrogen plasma is used in the second method, nitrogen functional groups are formed on the surface of the first resin layer 6e. Namely, a first region 6ej in which the ratio of N/C is relatively high is formed.

Further, when oxygen plasma is used in the second method, oxygen functional groups are formed on the surface of the first resin layer 6e. Namely, a first region 6ej in which the ratio of O/C is relatively high is formed.

After the plasma treatment, the first resin layer 6e is not exposed to the ambient air, but the sputtering of the next step is carried out. For example, the first resin layer 6e is transferred from a chamber in which the plasma treatment was carried out to a chamber in which the sputtering is to be carried out while keeping it in a vacuum atmosphere, or the sputtering is carried out in the chamber in which the plasma treatment was carried out while keeping the vacuum atmosphere. Note that, the "vacuum atmosphere" referred to here need only be an atmosphere lower than the ambient air pressure, for example, is an atmosphere of 0.3 Pa to 1.5 Pa.

Note that, as understood from the above explanation, in the second method, when nitrogen plasma is used, a first region 6ej of the second aspect (where the ratio of N/C is high) is formed. Further, when the oxygen plasma is used, a first region 6ej of the first aspect (where the ratio of O/C is high) is formed.

In the first method and second method, the time during which the circuit board 2 is exposed to the plasma is preferably 20 seconds to 1800 seconds. The pressure in the chamber is preferably 0.01 Pa to 100 Pa. The output per area applied to the electrode is preferably 0.05 W/cm$^2$ to 0.7 W/cm$^2$. The temperature in the chamber is preferably 100° C. to 130° C. Further, in the first method, the time during which the circuit board 2 is exposed to the ambient air is preferably 1 second to 24 hours.

Figure 9:
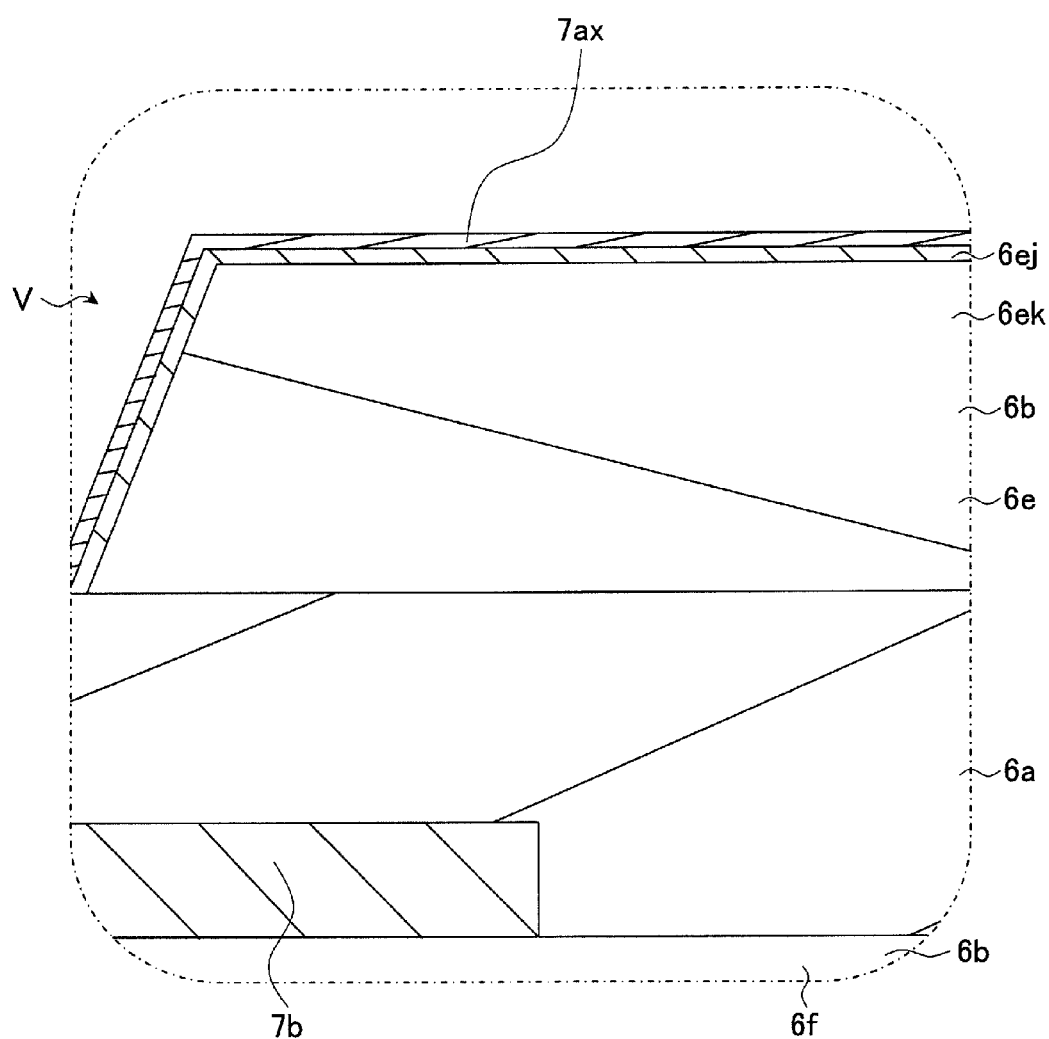
FIG. 9 An enlarged view explaining a production step in an X1 portion of the circuit assembly shown in FIG. 1.

(13) As shown in FIG. 9, the circuit board 2 is heated while the first metal is sputtered onto the surface of the high heat resistance resin layer 6b. Due to this, the metal carbide layer 7ax is formed as a carbide of the first metal. Note that, due to the plasma in the step of (12) described above, the surface of the high heat resistance resin layer 6b is attacked and become an activated radical state. Then, it is guessed that the metal carbide is formed by the surface of the high heat resistance resin layer 6b and the sputtered first metal chemically bonding at the time of sputtering. Further, it is guessed that, by the energy of heating and sputtering, a portion of the resin contained in the high heat resistance resin layer 6b is cleaved, and bonding between the first metal and a portion of the resin is promoted.

The temperature for heating the circuit board 2 is preferably set to less than the thermal decomposition temperature of the resin contained in the high heat resistance resin layer 6b. As a result, the thermal decomposition of the resin can be reduced, and the reliability of the circuit board 2 can be maintained. Further, when a polyimide benzoxazole resin is used as the resin contained in the high heat resistance resin layer 6b, preferably the temperature for heating the circuit board 2 is set to 110° C. to less than 300° C. By setting the temperature for heating the circuit board 2 at 110° C. or more, a reaction between the first metal and a portion of the resin is promoted, and the formation of the carbide of the first metal is promoted. Further, by setting the temperature for heating the circuit board 2 at less than 300° C., it is considered that generation of free carbon due to thermal decomposition of the resin in the high heat resistance resin layer 6b can be reduced. For this reason, the bonding strength between the high heat resistance resin layer 6b and the metal carbide layer 7ax can be increased.

Further, the output for the sputtering of the first metal is preferably set to 100 W to less than 2000 W. By setting the output of the sputtering of the first metal at 100 W or more, a deposition time of the first metal can be shortened. Further, by setting the output of the sputtering of the first metal at less than 2000 W, deterioration of the resin can be reduced. Further, the sputtering of the first metal is preferably carried out under a vacuum condition. At this time, the degree of vacuum is preferably set at 0.3 Pa to 1.5 Pa.

Here, the formation of the metal carbide layer 7ax by sputtering may be confirmed by examining a cross-section of the circuit board 2 by using a transmission electron microscope. Further, the fact that the metal carbide layer 7ax contains the carbide of the first metal can be confirmed by analyzing the first conductive layer 7a of the circuit board 2 by using conventionally known Auger electron spectroscopy.

Figure 10:
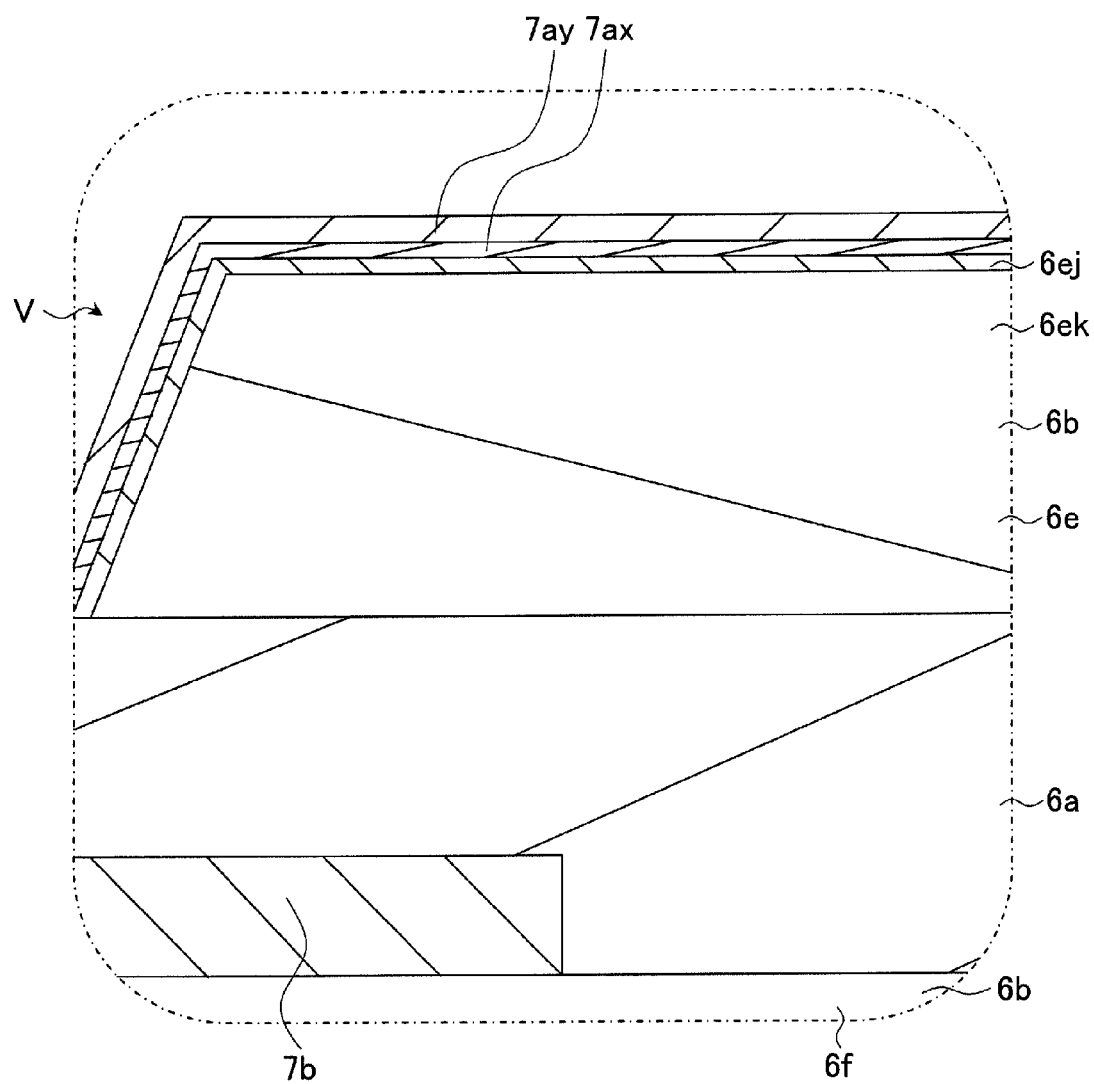
FIG. 10 An enlarged view explaining a production step in an X1 portion of the circuit assembly shown in FIG. 1.

(14) As shown in FIG. 10, by continuing the sputtering shown in the step of (13), the first metal layer 7ay is formed. Here, the temperature for heating the circuit board 2 is preferably set at less than 130° C. As a result, the first metal layer 7ay can be easily formed.

Figure 11:
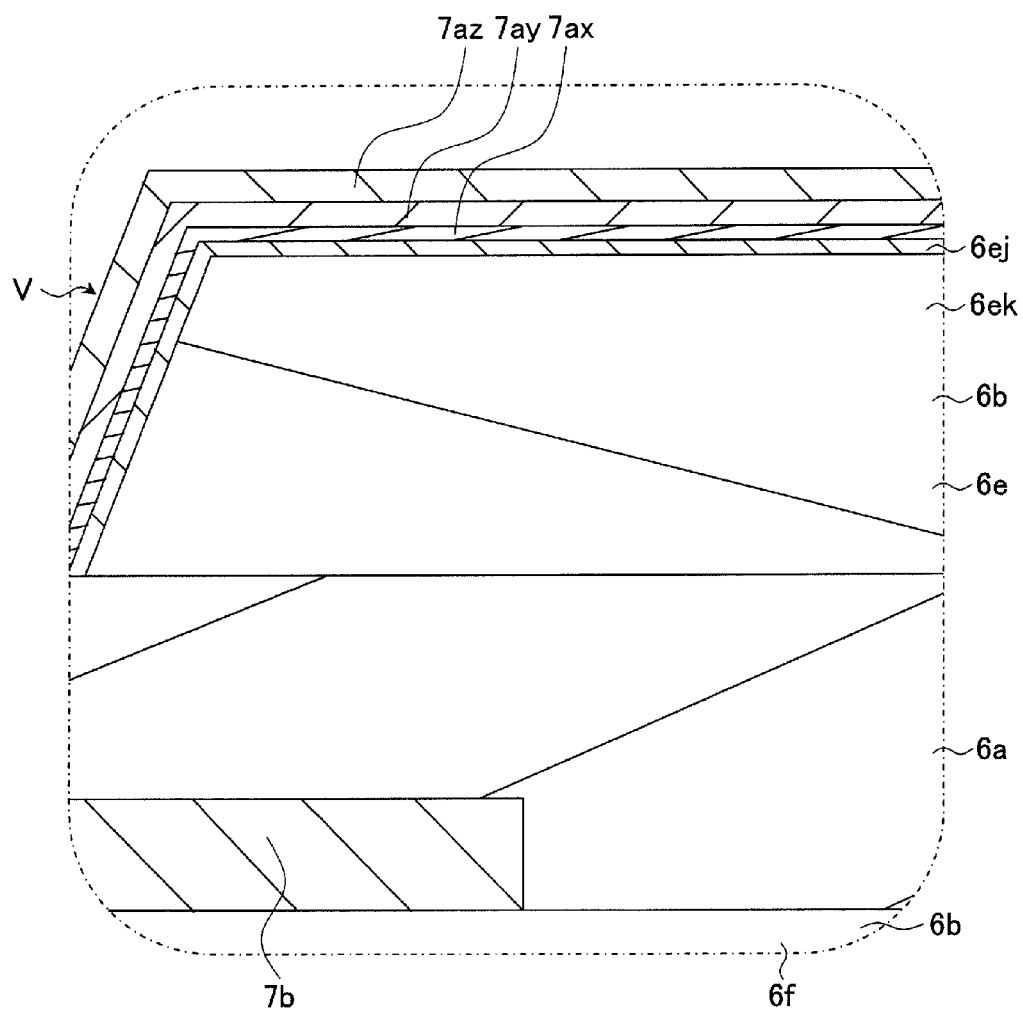
FIG. 11 An enlarged view explaining a production step in an X1 portion of the circuit assembly shown in FIG. 1.

(15) As shown in FIG. 11, by sputtering of the second metal on the surface of the first metal layer 7ay, the second metal layer 7az is formed. Further, by forming the second metal layer 7az, invasion of oxygen into the first metal layer 7ay and the metal carbide layer 7ax is reduced, so oxidation of the carbide of the first metal can be reduced. As a result, the content of the carbide of the first metal in the metal carbide layer 7ax is maintained, and the bonding strength between the high heat resistance resin layer 6b and the metal carbide layer 7ax can be maintained. Here, during one series of steps from the step of (13) to the step of (15), preferably the vacuum state in the film forming system is maintained. Due to this, invasion of oxygen into the first metal layer 7ay and the metal carbide layer 7ax can be reduced. Note that, the output for the sputtering of the second metal is preferably set at 500 W or more.

Figure 12:
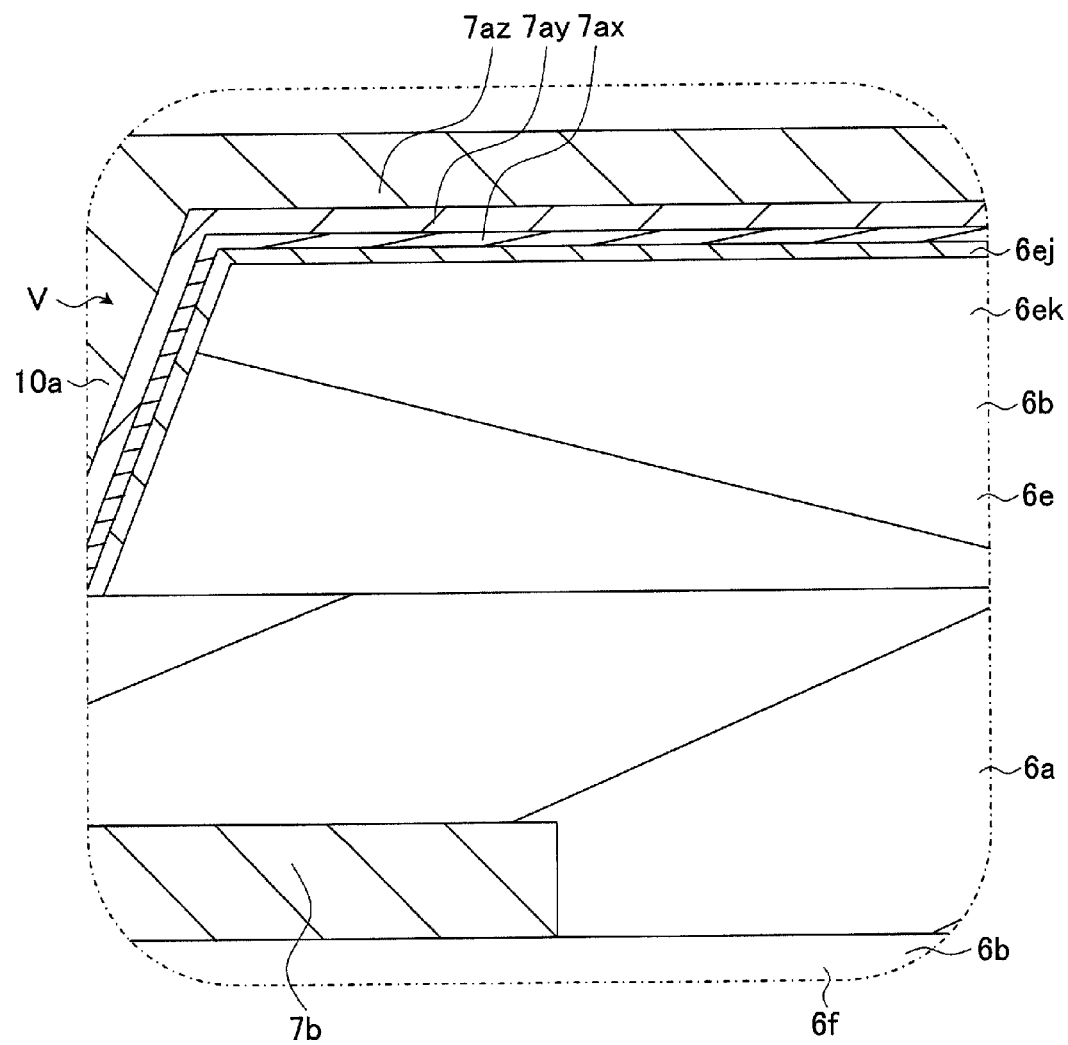
FIG. 12 An enlarged view explaining a production step in an X1 portion of the circuit assembly shown in FIG. 1.

(1) As shown in FIG. 12, by electroplating or the like, the second metal is deposited on the surface of the second metal layer 7az. As a result, the thickness of the second metal layer 7az can be easily made larger. Further, the second metal layer 7az can be filled in the via holes V, therefore the first via conductors 10a can be easily formed.

Figure 13:
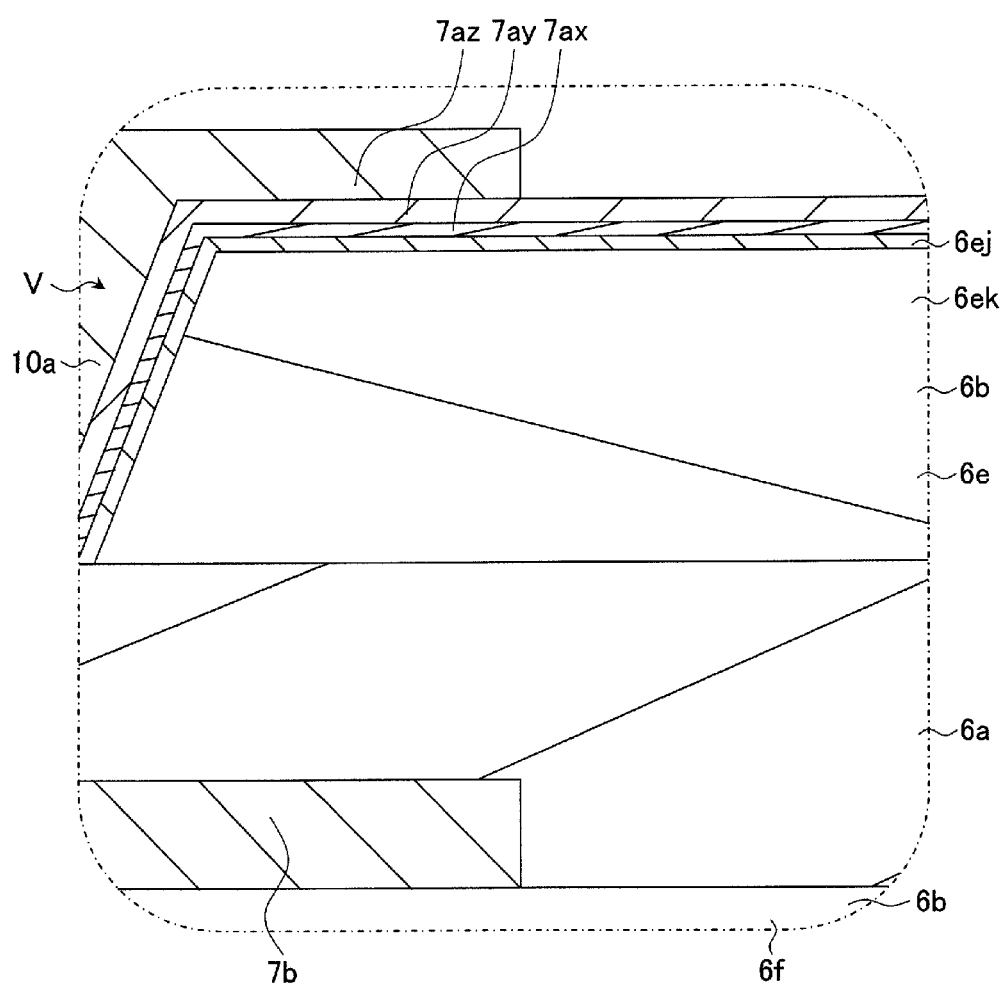
FIG. 13 An enlarged view explaining a production step in an X1 portion of the circuit assembly shown in FIG. 1.

(17) As shown in FIG. 13, the second metal layer 7az is patterned. The patterning is carried out by using photolithography, etching, or the like.

Figure 14:
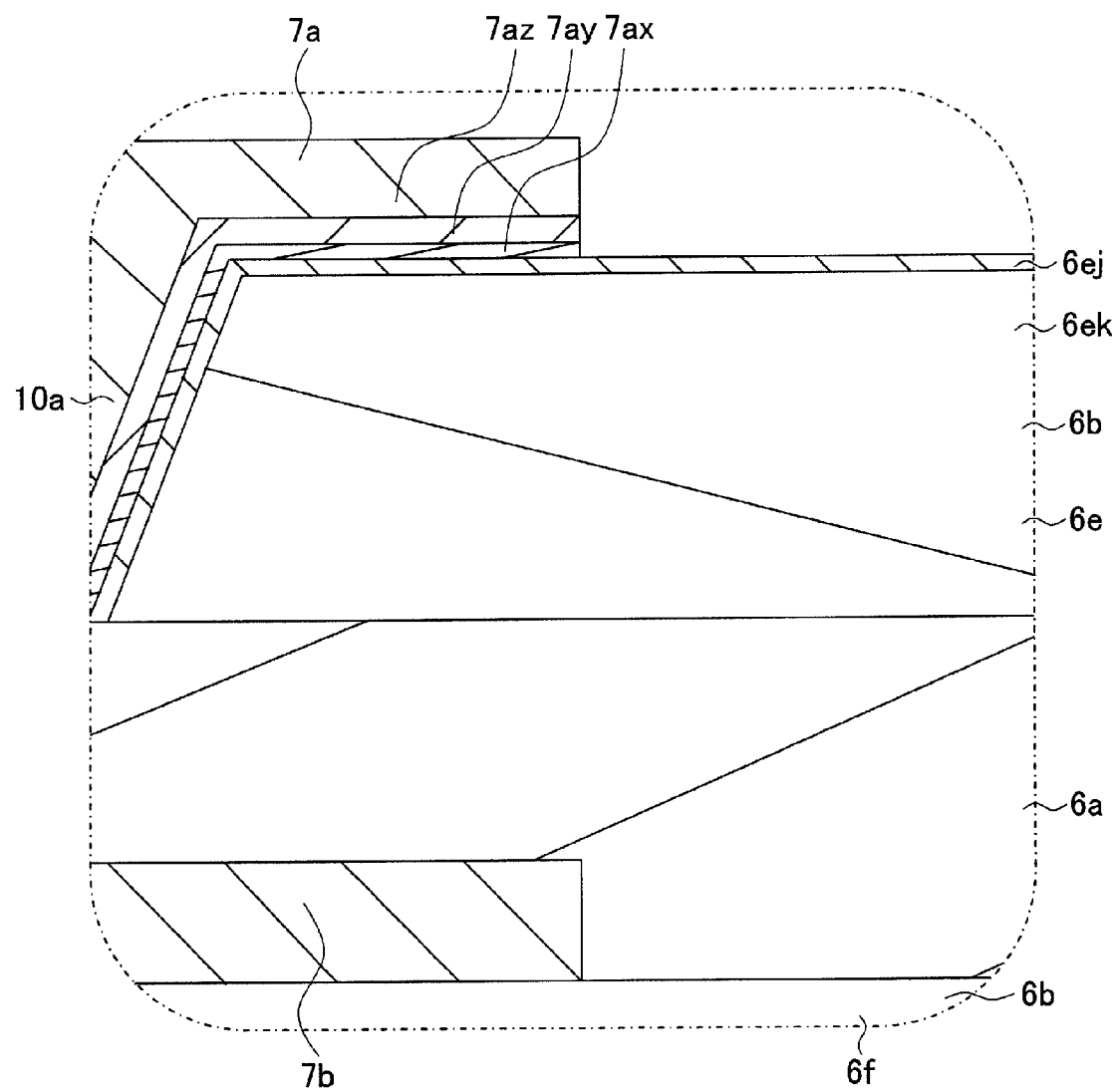
FIG. 14 An enlarged view explaining a production step in an X1 portion of the circuit assembly shown in FIG. 1.
Figure 15A:
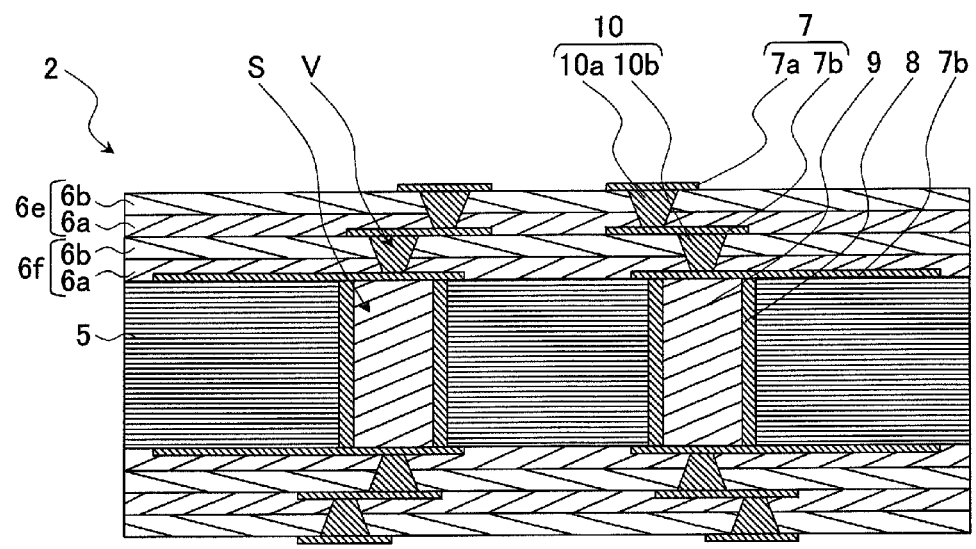
FIG. 15A and FIG. 15B are cross-sectional views explaining a production step of the circuit assembly shown in FIG. 1.

(18) As shown in FIG. 14, the first metal layer 7ay and metal carbide layer 7ax are patterned. The patterning is carried out by using photolithography, etching, or the like. As a result, as shown in FIG. 15A, the first conductive layer 7a can be formed. The circuit board 2 can be prepared as described above.

Figure 15B:
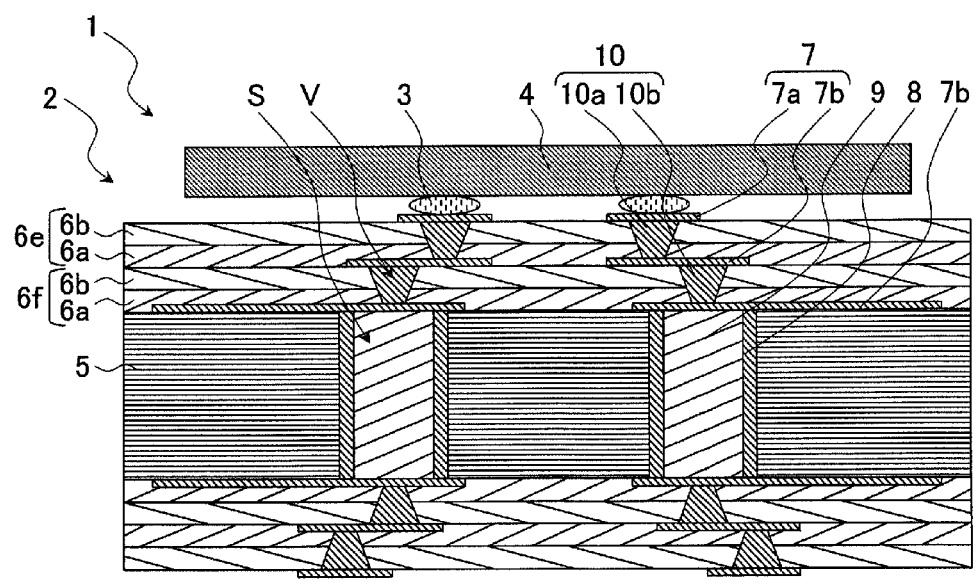

(19) As shown in FIG. 15B, the electronic component 4 is flip-chip mounted on the circuit board 2 through bumps 3. Due to this, the circuit assembly 1 can be fabricated.

The present invention is not limited to the above aspects. Various alterations and improvements are possible within a range not out of the gist of the present invention.

For example, in the embodiment of the present invention explained above, the explanation was given using as an example a constitution in which each of the insulating layers 6 formed on the top surface and bottom surface of the substrate 5 was comprised of two layers, but the insulating layers 6 may be comprised of one layer or three or more layers as well. The insulating layers 6 are not limited to ones having the bonding layer 6a and high heat resistance resin layer 6b. For example, the insulating layers 6 may be resin layers comprised of single layers formed by coating a liquid resin or press-fixing a resin film. The first resin layer 6e may be roughened as well.

Further, in the embodiment of the present invention explained above, the explanation was given using as an example a constitution flip-chip mounting the electronic component 4 on the top surface of the circuit board 2, but the electronic component 4 may be wire bonded on the top surface of the circuit board 2 as well.

Figure 16:
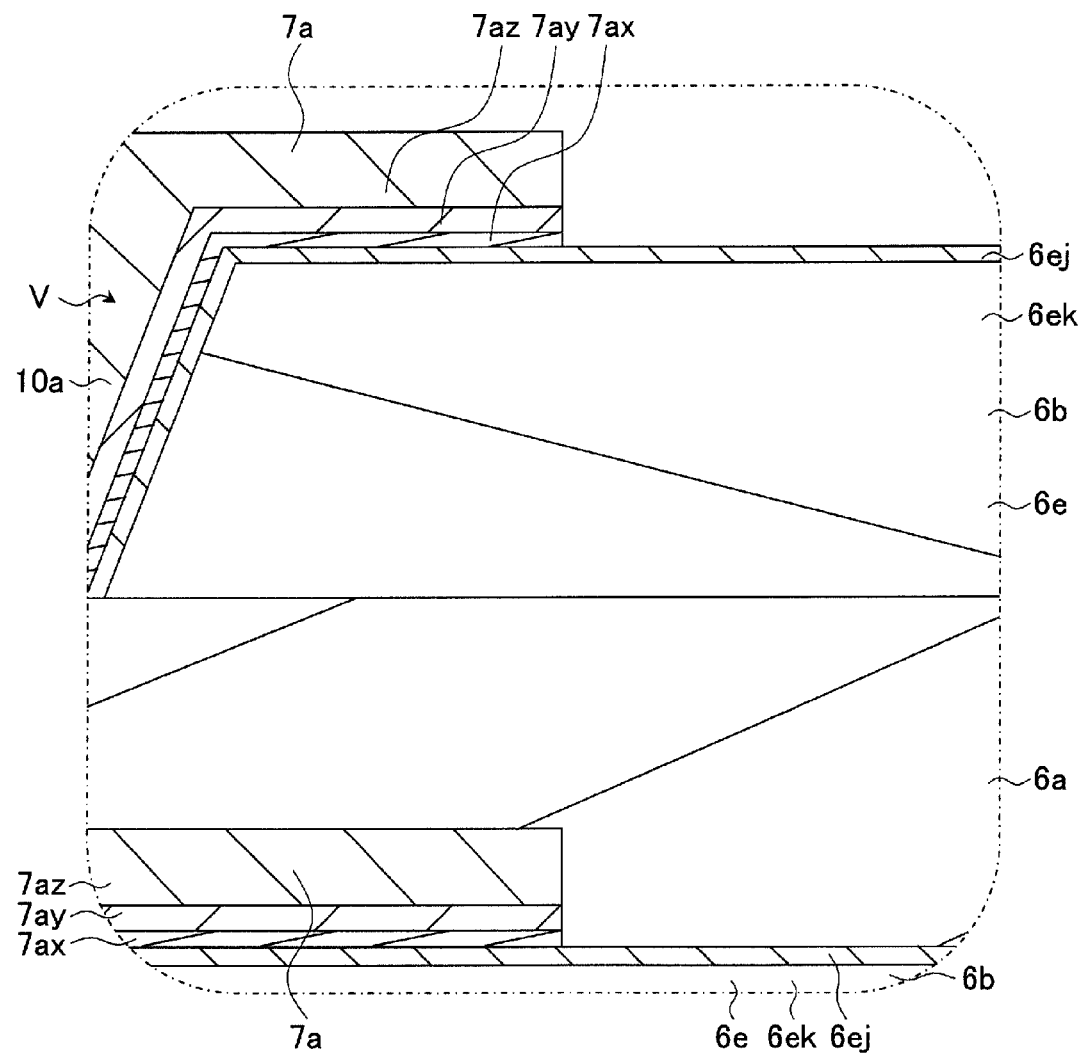
FIG. 16 An enlarged view of a portion corresponding to the X1 portion of FIG. 1 in a circuit assembly according to another embodiment of the present invention.

Further, in the embodiment of the present invention explained above, an example in which the first resin layer 6e and first conductive layer 7a formed the uppermost layers of the insulating layers 6 and conductor layers 7 was shown. However, as shown in FIG. 16, the first resin layer 6e and first conductive layer 7a may form layers other than the uppermost layers of the insulating layers 6 and conductor layers 7 as well. In this case, the bonding strength between layers of the insulating layers 6 and the conductor layers 7 other than the uppermost layers can be increased.

Further, in the embodiment of the present invention explained above, the explanation was given using as an example the method of production forming the first conductive layer 7a by the subtractive method of patterning using photolithography, etching, or the like. However, the first conductive layer 7a may also be formed by the semi-additive method, full additive method, etc.

Note that, from the present embodiment, the following invention of the method of production of a circuit board can be extracted.

A method of production of a circuit board of a first aspect has:
a step of plasma treating a major surface of a resin layer;
a step of exposing the plasma-treated major surface to the ambient air; and a step of using sputtering to form a conductive layer containing a transition metal selected from Group IV, Group V, or Group VI in the Periodic Table on the major surface after exposure to the ambient air.

A method of production of a circuit board of a second aspect has:

a step of plasma treating a major surface of a resin layer by nitrogen plasma and a step of using sputtering to form a conductive layer containing a transition metal selected from Group IV, Group V, or Group VI in the Periodic Table on the major surface after the plasma treatment.

In the method of production of a circuit board of the second aspect, preferably the major surface is plasma treated, then subjected to sputtering in a state where a vacuum atmosphere is kept.

In the method of production of a circuit board of the second aspect, preferably the transition metal is titanium.

EXAMPLES

Conditions and Evaluation Items Etc.

(Constitution of Plasma System Etc.)

The constitution of the plasma system and conditions common to a plurality of examples and comparative examples will be shown below.

Electrode: Parallel plate type, area 1487.5 cm$^2$

Power supply: RF (high frequency) power supply, frequency 13.56 MHz

Volume of chamber: 129569 cm$^3$

Pressure in chamber: 0.01 Pa to 100 Pa (Type of Plasma)

A variety of plasmas were used to set a plurality of examples and comparative examples. Specifically, use was made of argon plasma, nitrogen plasma, and oxygen plasma. Note that, in the drawings explained below, the types of these plasmas will be sometimes abbreviated as "Ar", "C", and "O2 (or $O_2$)".

(Output of Plasma Treatment)

A plurality of examples and comparative examples were set within a range of from 100 W to 1000 W so that the output of power per area applied to the electrodes became 0.05 W/cm$^2$ to 0.7 W/cm$^2$. Note that, in the present application, the results of 200 W to 600 W are described.

(Time of Plasma Treatment)

By changing the time of the plasma treatment, a plurality of examples and comparative examples were set. Specifically, the time of plasma treatment was set within a range of from 1 to 30 minutes.

(Time of Exposure to Ambient Air)

The time of exposure to the ambient air was set to 1 hour to 24 hours.

(Evaluation Item: Peel Strength)

As the evaluation item of the examples and comparative examples, the peel strength (g/cm) was measured. The peel strength is the force necessary for peeling off a conductor layer 7 from an insulating layer 6 and was measured according to JIS C6481:1996. In the examples, the conductor layer 7 and insulating layer 6 for which the peel strength is measured are the first conductive layer 7a and first resin layer 6e.

The peel strength differs between that immediately after the formation of the conductor layer 7 and that after the circuit board 2 is placed at a high temperature environment. Therefore, the peel strengths were measured immediately after the sputtering (sometimes shown as "initial stage" in the drawings) and after baking over suitable periods after the sputtering. The periods of the baking were 1 day, 2 days, 5 days, 10 days, etc. The temperature of baking was 172° C.

Examples According to First Method

As explained at the step of (12) of the embodiment, as the method of making at least one of the O/C and N/C larger at the surface of the first resin layer 6e, the two methods of the first and second methods can be mentioned. First, examples according to the first method (method of exposing the circuit board 2 to the ambient air after plasma treatment) will be explained.

Examples 1 to 16 and Comparative Examples 1 to 8

Figure 17:
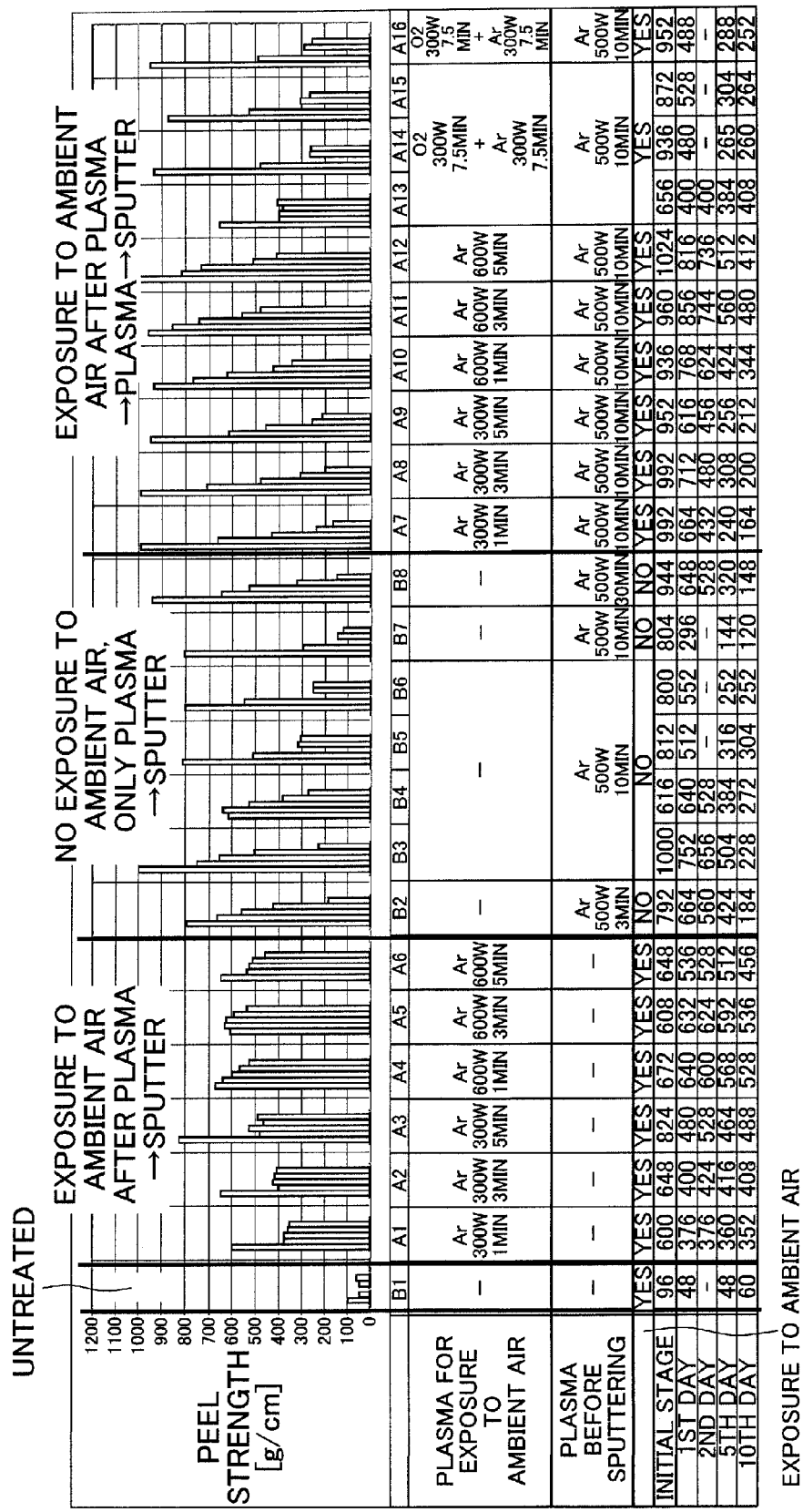
FIG. 17 A view showing conditions and evaluation results of Examples 1 to 16 of the present invention.

The top part of FIG. 17 is a graph showing evaluation results of the examples and comparative examples, while the bottom part is a table showing conditions and evaluation results of the examples and comparative examples. The abscissa of the graph of the top part and the columns of the table of the bottom part correspond to each other and show Examples 1 to 16 (A1 to A16) and Comparative Examples 1 to 8 (B1 to B8).

The ordinate of the graph of the top part shows the peel strength. In each of the examples and comparative examples, five peel strengths are shown by the graph of the top part. These five peel strengths correspond to, from the left side of the page in FIG. 17, the peel strengths at an initial stage (no baking), after baking for 1 day, after baking for 2 days, after baking for 5 days, and after baking for 10 days.

The row of "Plasma for exposure to ambient air" in the table of the bottom part shows the conditions relating to the plasma treatment before exposing the circuit board to the ambient air. Specifically, it shows the types of plasma, outputs of the plasma treatment, and times of the plasma treatment. "-" shows that no corresponding plasma treatment was carried out.

The row of "Plasma before sputtering" in the table of the bottom part shows the conditions relating to the plasma treatment before the sputtering. Note that, in the examples, this plasma treatment is performed after exposure to the ambient air and before the sputtering. The displayed items are the same as those of the row of "Plasma for exposure to ambient air".

The row of "Exposure to ambient air" shows whether the circuit board was exposed to the ambient air after the plasma treatment (plasma treatment of row of "Plasma for exposure to ambient air").

The rows of "Initial stage", "1st day", "2nd day", "5th day", and "10th day" show the peel strengths (g/cm) at the respective timings.

Examples 1 to 6 (A1 to A6) are examples where the circuit board was exposed to the ambient air after plasma treatment, then sputtering was carried out. Examples 7 to 16 (A7 to A16) are examples where the circuit board was exposed to the ambient air after plasma treatment, plasma treatment was carried out again after that, then sputtering was carried out. Comparative Example 1 is an example where plasma treatment was not carried out. Comparative Examples 2 to 8 are examples where sputtering was carried out after plasma treatment while keeping the circuit board in a vacuum atmosphere. The material forming the high heat resistance resin layer 6b was made a polyimide resin. The metal carbide layer 7ax and first metal layer 7ay were formed by sputtering of nichrome.

In Examples 1 to 6, compared with Comparative Examples 2 to 8, the drop in the peel strength when holding the circuit board at a high temperature after sputtering is suppressed. As a result, the peel strength after the circuit board is exposed to a high temperature is higher in each of Examples 1 to 6 than in Comparative Examples 2 to 8.

In Examples 7 to 16, compared with Examples 1 to 6, there is a large drop in the peel strength when holding the circuit board at a high temperature after sputtering. However, as seen in Examples 10 to 12, if the plasma treatment before exposure to the ambient air is sufficiently carried out, the drop in the peel strength is kept to less than that in Comparative Examples 2 to 8.

Note that, as shown in Comparative Example 1, without performing plasma treatment, even when the circuit board is exposed to the ambient air, the peel strength is not improved.

Examples 17 and 18

Figure 18:
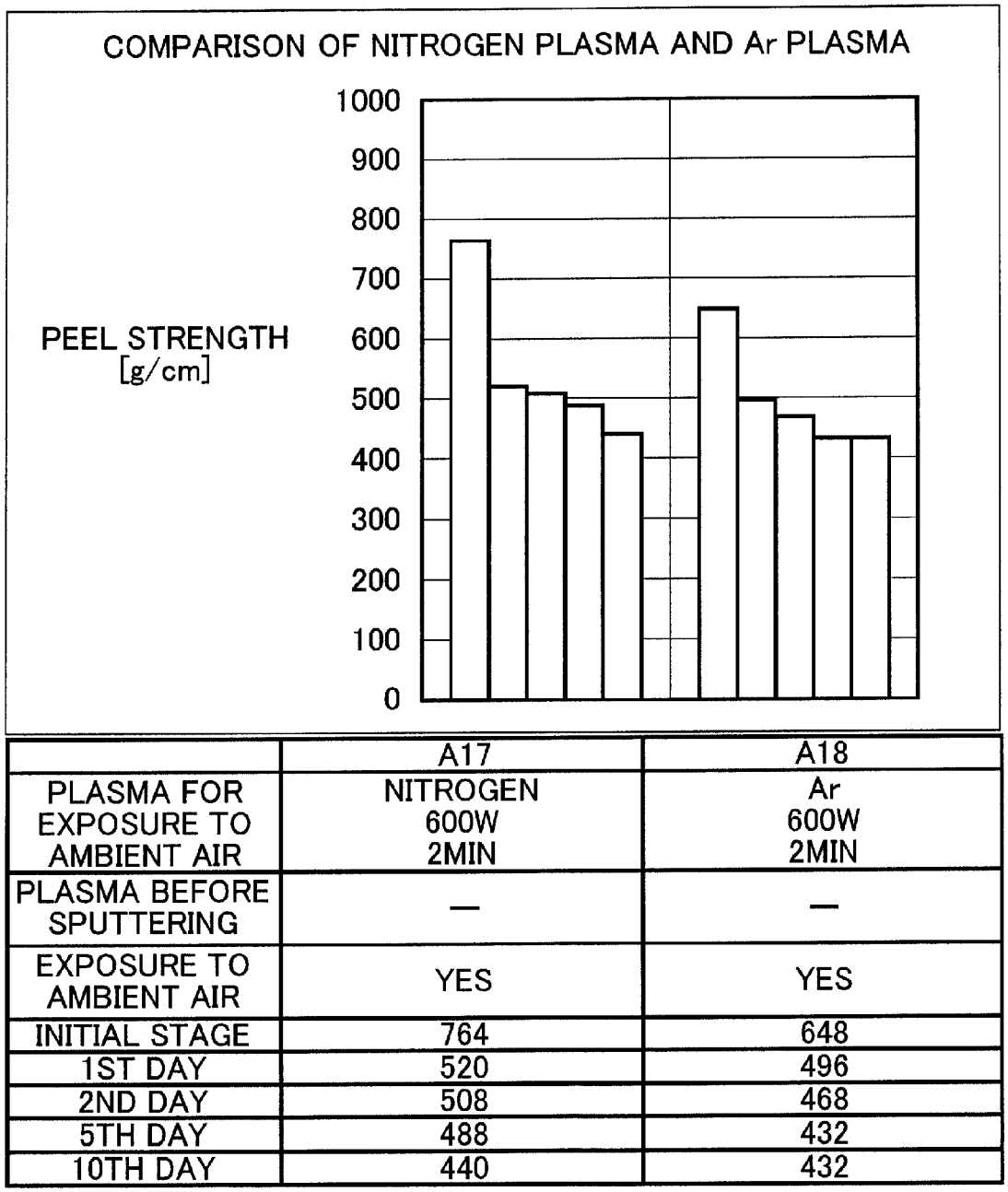
FIG. 18 A view showing conditions and evaluation results of Examples 17 and 18 of the present invention.

FIG. 18 shows evaluation results for Examples 17 and 18 (A17 and A18) in the same way as FIG. 17. In Example 18, in the same way as Examples 1 to 16, plasma treatment is carried out by argon plasma. In contrast, in Example 17, plasma treatment is carried out by nitrogen plasma. The material forming the high heat resistance resin layer 6b was made a polyimide resin. The metal carbide layer 7ax and first metal layer 7ay were formed by sputtering of nichrome, while the second metal layer 7az was formed by sputtering of copper and electroplating. The total thickness of the metal carbide layer 7ax and the first metal layer 7ay is 75 nm. In the second metal layer 7az, the thickness formed by the sputtering is 500 nm, and the thickness formed by the electroplating is 18 μm.

It is seen from this figure that the effect of improvement of the peel strength is exhibited even in the case where plasma treatment is carried out by nitrogen plasma (Example 17) in the same way as the case where plasma treatment is carried out by argon plasma (Examples 1 to 16 and 18).

FIG. 19 shows results of measurement of the ratios of numbers of atoms of the high heat resistance resin layers (6b) of examples and a comparative example according to XPS analysis.

The high heat resistance resin layers in the examples are exposed to the ambient air after plasma treatment, while the high heat resistance resin layer in the comparative example is not subjected to plasma treatment. In the examples, the plasma treatment was carried out by argon plasma, oxygen plasma, or nitrogen plasma. Further, in the comparative example, the row at the top part shows experimental values, and the row at the bottom part shows calculated values. Note that, the plasma treatment was carried out in the plasma system explained above under conditions of a pressure in the chamber of 10 to 20 Pa, an output of 600 W, and a treatment time of 2 minutes. Further, the high heat resistance resin layer after treatment was placed in the XPS apparatus and analyzed within 3 hours.

The column of "Take-off angle of 20 deg." shows the ratio of the numbers of atoms, at a depth up to about 5 nm from the surface of the high heat resistance resin layer, obtained by firing X-rays at an angle of 20 degrees with respect to the surface of the high heat resistance resin layer. In the same way, the column of "Take-off angle of 45 deg." shows the ratio of the numbers of atoms, at a depth up to about 10 nm from the surface of the high heat resistance resin layer, obtained by firing X-rays at an angle of 45 degrees with respect to the surface of the high heat resistance resin layer. Note that, the numerical values in parentheses show the differences from the numerical values in the top part of the comparative example.

In the examples, compared with the comparative example, the O/C at the surface of the high heat resistance resin layer becomes larger. Namely, in the examples, the O/C at the depth up to 5 nm becomes 0.332 to 0.398, that is, becomes 1.82 times to 2.19 times the calculated value. Further, the O/C at the inner portion side of the high heat resistance resin layer in the examples is guessed to be substantially equivalent to the O/C at the surface of the high heat resistance resin layer in the comparative example. Therefore, in examples, it can be guessed that the O/C has become larger at the surface side than at the inner portion side. Note that, in the examples, O/C at the depth up to 5 nm becomes larger than that at the depth up to 10 nm. In contrast, in the comparative example, the O/C becomes larger at the depth up to 10 nm than that at the depth up to 5 nm. Namely, in the examples, the O/C at the depth up to 5 nm becomes 1.06 times to 1.12 times the O/C at the depth up to 10 nm.

Further, in the example using nitrogen plasma, compared with comparative example or other examples, the N/C at the surface of the high heat resistance resin layer becomes larger. Namely, in the example using nitrogen plasma, the N/C at the depth up to 5 nm becomes 0.126, that is, becomes 1.38 times the calculated value. Further, in the same way as the O/C, in the example using nitrogen plasma, it can be guessed that the N/C becomes larger at the surface side than at the inner portion side. Note that, in the example using nitrogen plasma, the N/C becomes larger at the depth up to 5 nm than that at the depth up to 10 nm. In contrast, in the comparative example and other examples, the N/C becomes larger at the depth up to 10 nm than at the depth up to 5 nm. Namely, in the example using nitrogen plasma, the N/C at the depth up to 5 nm becomes 1.06 times the N/C at the depth up to 10 nm.

As described above, it can be guessed that the improvement of the peel strength in the examples was caused by the ratio of O/C becoming larger at the surface of the high heat resistance resin layer 6b. In other words, the first region 6ej is larger in O/C than the second region 6ek and the peel strength is improved due to this.

Figure 20:
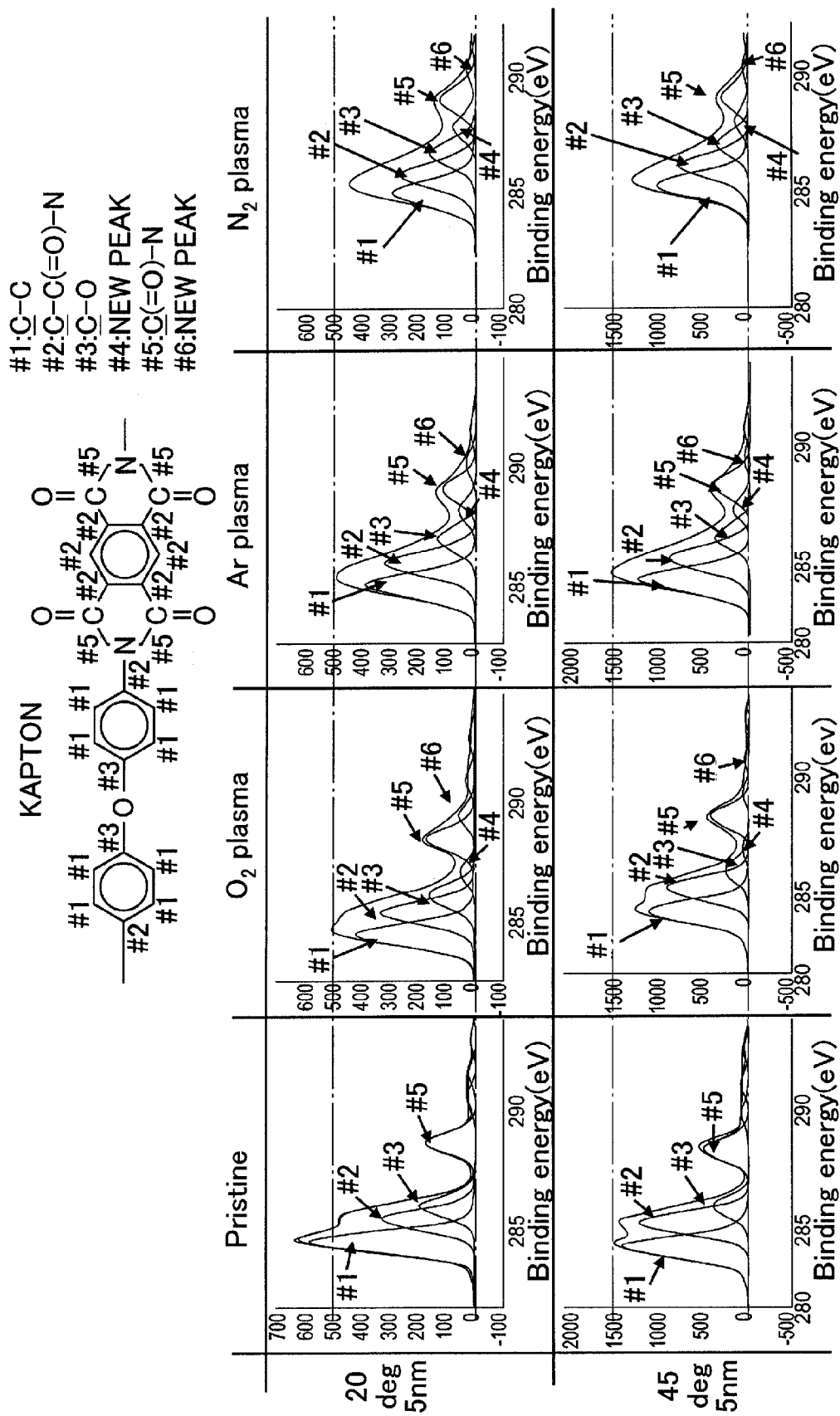
FIG. 20 A view showing analysis results relating to the structures of the resin layers of embodiments of the present invention.

In FIG. 20, the structural formula at the upper portion of the page shows the structural formula of Kapton® made by Du Pont-Toray as an example of the high heat resistance resin layer 6b. Further, the plurality of graphs at the lower portion of the page in FIG. 20 show the results of the XPS analysis of the high heat resistance resin layers (Kapton®) in the examples and comparative examples shown in FIG. 19. The abscissa shows the binding energy of photoelectrons, while the ordinate shows the number of photoelectrons.

In the graphs of the comparative example ("Pristine"), peaks of the number of photoelectrons occur corresponding to #1 to #3 and #5 described in the portions of the structural formula. On the other hand, in the examples ("$O_2$ plasma", "Ar plasma", and "$N_2$ plasma"), in addition to the peaks occurring in the comparative example, new peaks (#4 and #6) occur. It is guessed that the peak of #4 corresponds to C—C (═O), and the peak of #6 corresponds to C—C(═O)—OH.

As described above, it can be guessed that the reason for the improvement of the peel strength in the examples is the increase of the carbonyl groups at the surface of the high heat resistance resin layer 6b. In other words, in the first region 6ej, the ratio of the number of carbon atoms contained in the carbonyl groups with respect to the number of all carbon atoms is larger than that in the second region 6ek and the peel strength is improved due to this.

The O/C (carbonyl groups) increased by plasma treatment of the circuit board 2 explained above and exposure to the ambient air further increases by sputtering. Further, by sputtering, a chemical bond between the resin and the metal occurs. Results of analysis showing that will be shown below.

FIG. 25 shows the results of measurement of the ratio of the numbers of atoms of the high heat resistance resin layers (6b) of the examples by XPS analysis.

The row of "Calculating" shows the calculated values. The row of "Pristine" shows the ratio of the numbers of atoms of the high heat resistance resin layers before plasma treatment. The row of "Ar plasma" shows the ratio of the numbers of atoms of the high heat resistance resin layers subjected to plasma treatment by Ar plasma, then exposed to the ambient air. The row of "NiCr sputtering" shows the ratio of the numbers of atoms of the high heat resistance resin layers subjected to plasma treatment by Ar plasma, then exposed to the ambient air, and further subjected to sputtering of NiCr.

Namely, the rows of "Pristine", "Ar plasma", and "NiCr sputtering" show changes of the ratio of the numbers of atoms along with the progress of fabrication process in the order of the same. Note that, the previously explained FIG. 19 shows the ratio of the numbers of atoms before sputtering in the same way as "Ar plasma" in FIG. 25.

The column of "Take-off angle (deg)" shows, in the same way as FIG. 19, the ratio of the numbers of atoms, at the depth within a range of about 5 nm to 10 nm from the surface of the high heat resistance resin layer, obtained by firing X-rays at an angle of 20 degrees or 45 degrees with respect to the surfaces of the high heat resistance resin layers.

The conditions up to the Ar plasma are similar to those in FIG. 19. Note, the high heat resistance resin used for analysis in FIG. 25 is a polyimide benzoxazole resin. Further, the sputtering was carried out under conditions of an output of 1200 W, a time of 2 seconds, and a temperature of 130° C.

The O/C increases when the fabrication process proceeds from "Ar plasma" to "NiCr sputtering". Specifically, the O/C increases about 1.8 times when the "Take-off angle (deg)" is 20 degrees and increases to about 1.6 times when the "Take-off angle (deg)" is 45 degrees.

It is seen from these results that due to sputtering, C is oxidized and the oxygen functional groups increase. Further, it is guessed that, due to such an increase of oxygen functional groups, bonding between the resin and Cr is promoted, and consequently adhesion between the resin and NiCr increases, and the peel strength is improved.

On the other hand, the N/C is reduced when the fabrication process proceeds from "Ar plasma" to "NiCr sputtering". Specifically, the N/C is reduced to about 0.63 time when the "Take-off angle (deg)" is 20 degrees and is reduced to about 0.73 time when the "Take-off angle (deg)" is 45 degrees.

It is seen from these results that N is attacked and becomes free due to sputtering. Then, due to such a free state of N, bonding between the resin and Cr is promoted, and, consequently, it is guessed that contact between the resin and NiCr increases, so the peel strength is improved.

Figure 26:
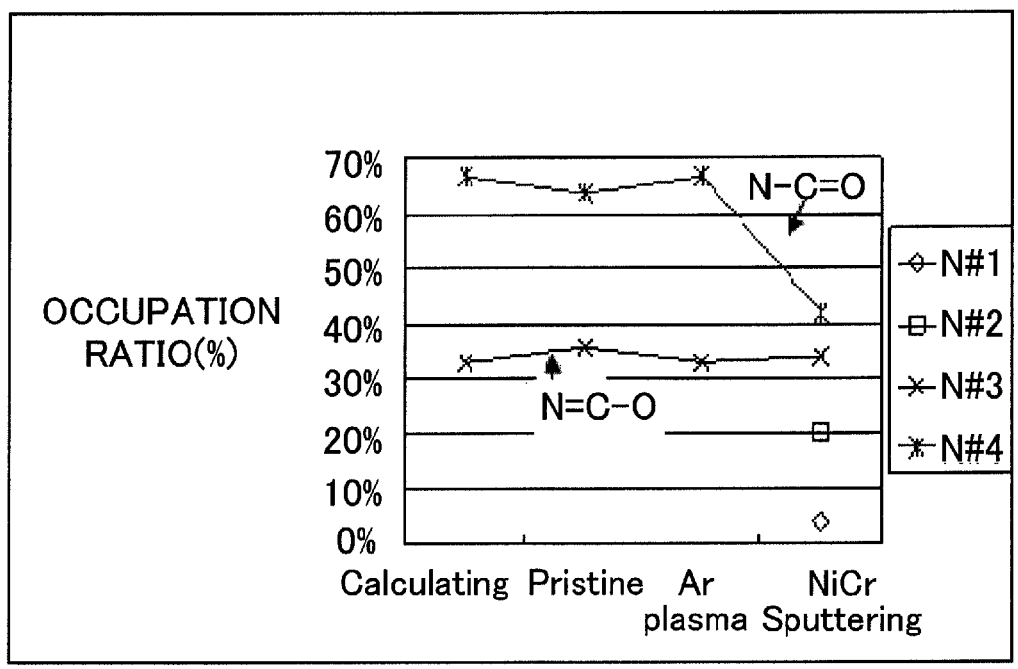
FIG. 26 Another view showing analysis results relating to the structures of the resin layers of embodiments of the present invention.

FIG. 26 shows results of an XPS narrow analysis of the high heat resistance resin layers in the examples shown in FIG. 25. The abscissa corresponds to "Calculating", "Pristine", "Ar plasma", and "NiCr sputtering" in FIG. 25. The ordinate shows ratios of various types of functional groups (N#1 to N#4) occupied in the high heat resistance resin layers based on the numbers of photoelectrons.

When sputtering is carried out, N#4 is reduced, and N#1 and N#2 appear. Here, N#4 is N—C=O. Accordingly, by sputtering, N—C=O is bonded with Cr, so the appearance of N#1 and N#2 is guessed. For example, formation of chemical bond of C—O—M (M is Ni or Cr) or coordinate bond of C=O and M (M is Ni or Cr) is considered.

Then, when the O/C (carbonyl groups) becomes large due to the plasma treatment and exposure to the ambient air, an increase of bonding amount between the carbonyl groups and Cr in sputtering and an improvement of the peel strength are guessed. Further, when the N/C becomes larger due to the plasma treatment and exposure to the ambient air, it is guessed that the carbonyl groups generated due to the freed state of N increase in the sputtering, the bonding amount between carbonyl group and Cr in sputtering increases, and the peel strength is improved.

FIG. 27 shows results of the XPS analysis showing an influence by the board exerted upon the metal layer.

Specifically, plasma treatment by Ar plasma, exposure to the ambient air, and sputtering were carried out for resin layers (examples) and silicon wafers (comparative examples), and XPS analysis was carried out. Note that, the examples are the same as the "NiCr sputtering" in FIG. 25 and FIG. 26. Further, in the comparative examples, the plasma treatment and sputtering are carried out in the same way as the examples. The NiCr layer has a thickness of about 0.5 nm. The column of "eV" shows values of binding energy with which numbers of photoelectrons of $Ni2p_{3/2}$ and $Cr2p_{3/2}$ become peaks. Note that, the column of "Difference" shows differences between the values of the column of "$Ni2p_{3/2}$" and values of the column of "$Cr2p_{3/2}$".

The peaks in the resins (examples) are shifted to the low energy side relative to the peaks in the silicon wafers (comparative examples). Specifically, concerning Ni, the peaks in the resins are shifted to the low energy side with a difference of 0.1 from the peaks in the silicon wafers. Concerning Cr, the peaks in the resins are shifted to the low energy side with a difference of 0.4 from the peaks in the silicon wafers. Note that, no significant difference was confirmed due to the difference of "Take-off angle (deg)".

It is seen from the above results that Cr stabilizes in state due to the influence of the resin. The reason for this is guessed to be the bonding of Cr with the resin.

As explained with reference to FIG. 19 to FIG. 27, it is guessed that the sputtered metal is chemically bonded with the resin subjected to the plasma treatment and exposure to the ambient air, and therefore the peel strength is improved. More specifically, it is considered that C—O—Cr is formed, or the coordinate bond of C=O with Cr is formed.

Examples According to Second Method

Next, an explanation will be given on examples according to the second method (method performing puttering without exposure of the circuit board to the ambient air after the plasma treatment by specific plasmas). Note that, the examples according to the first embodiment will be suitably shown.

Examples 19 to 23 and Comparative Examples 9 to 11

Figure 21:
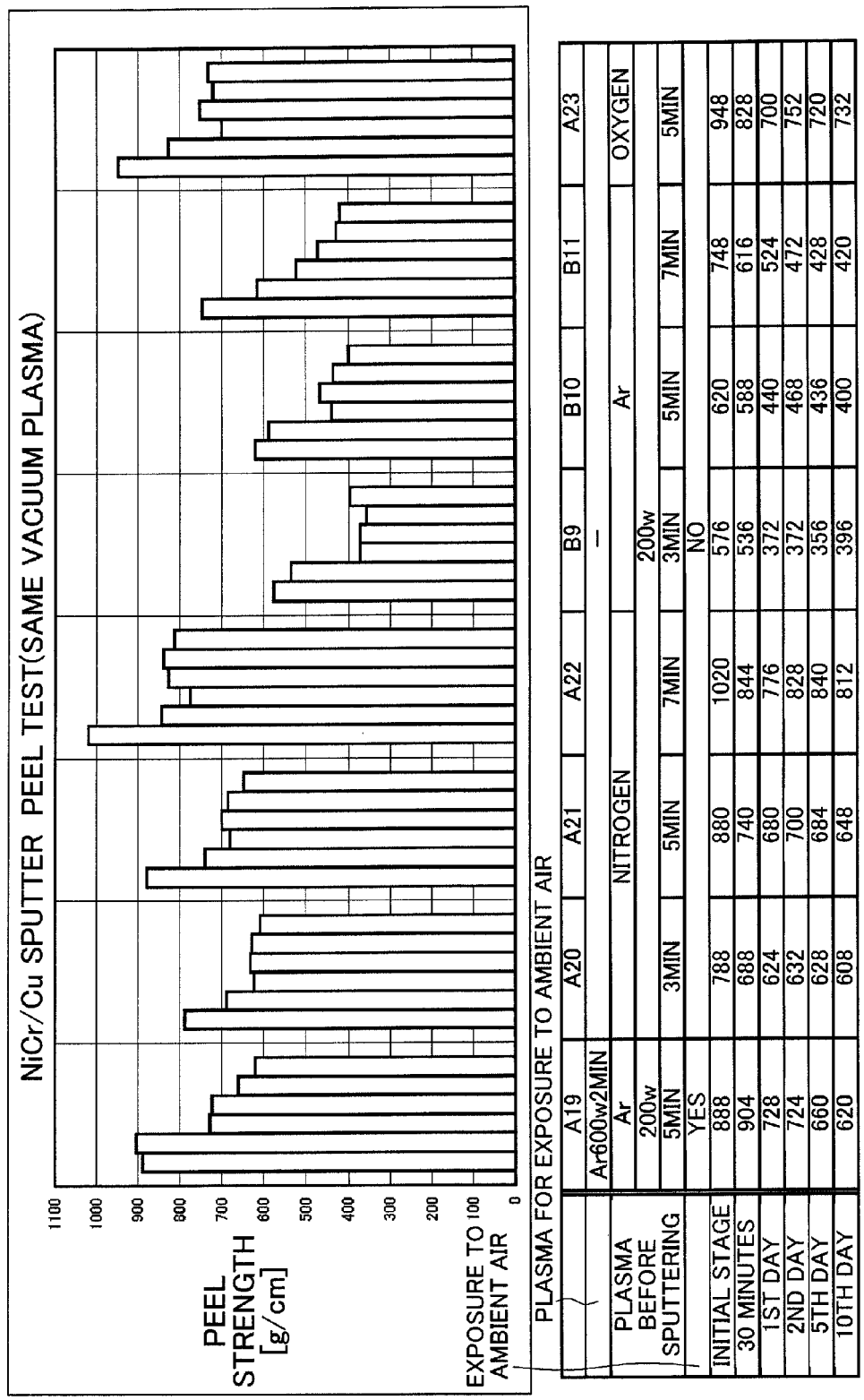
FIG. 21 A view showing conditions and evaluation results of Examples 19 to 23 of the present invention.

FIG. 21 shows evaluation results for Examples 19 to 23 (A19 to A23) and Comparative Examples 9 to 11 (B9 to B11) in the same way as FIG. 17. Example 19 is an example according to the first method, Examples 20 to 22 are examples according to the second method using nitrogen plasma, and Example 23 is an example according to the second method using oxygen plasma. Comparative Examples 9 to 11 are examples in which the sputtering was carried out without exposure of the circuit board to the ambient air after the plasma treatment by argon plasma. The material forming the high heat resistance resin layer 6b was made a polyimide resin. The metal carbide layer 7ax and first metal layer 7ay were formed by sputtering of nichrome, while the second metal layer 7az was formed by sputtering of copper and electroplating.

As shown in this figure, even when the circuit board is not exposed to the ambient air, when plasma treatment is carried out by nitrogen plasma or oxygen plasma, the peel strength is improved.

Examples 24 to 30 and Comparative Examples 12 to 13

Figure 22:
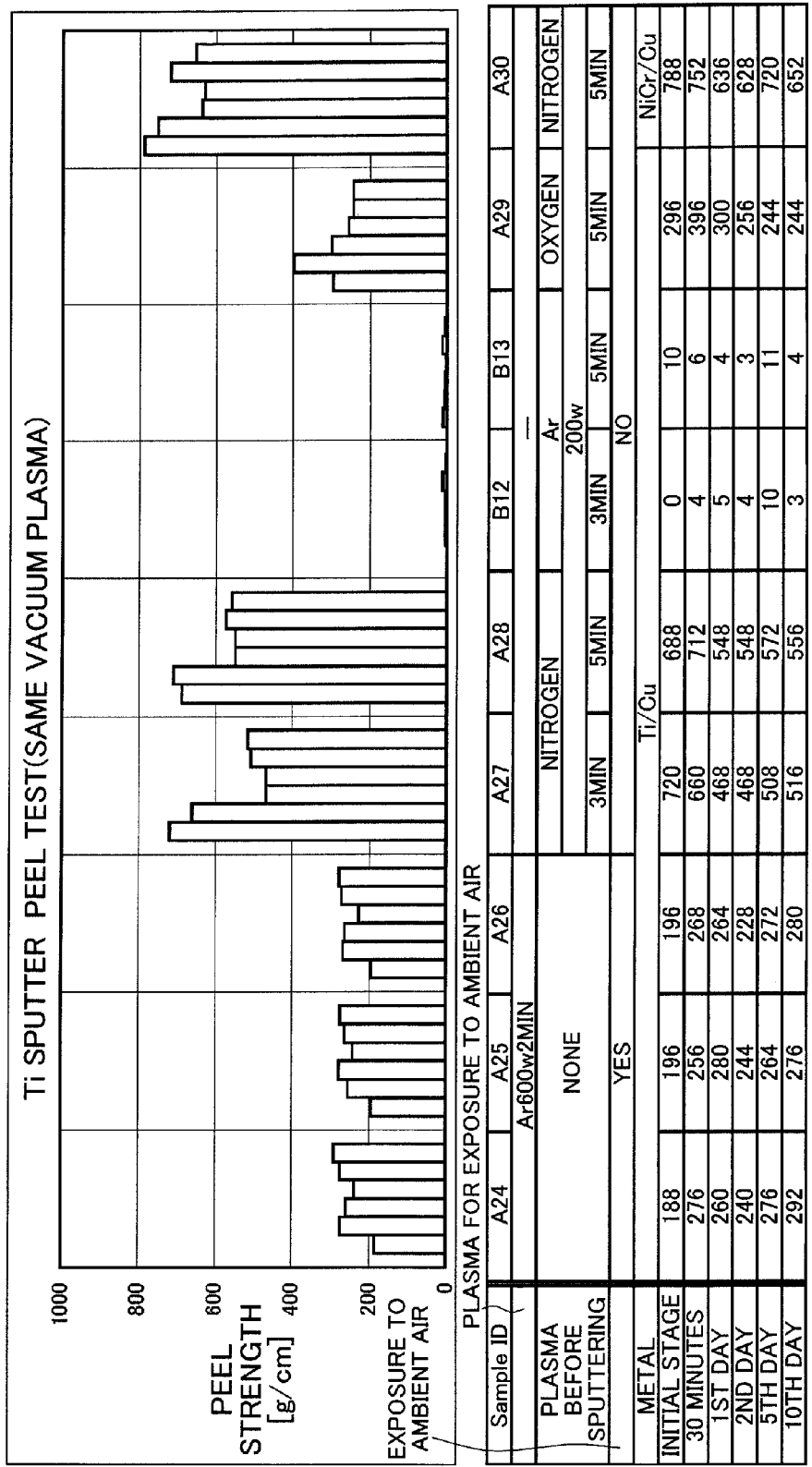
FIG. 22 A view showing conditions and evaluation results of Examples 24 to 30 of the present invention.

FIG. 22 shows evaluation results for Examples 24 to 30 (A24 to A30) and Comparative Examples 12 to 13 (B12 to B13) in the same way as FIG. 17.

In the table at the bottom part of FIG. 22, in addition to items of the tables at the bottom part of FIG. 17 etc., the row of "Metal" is provided as well. In this row, Ti/Cu shows that the metal carbide layer 7ax and first metal layer 7ay were formed by sputtering of titanium, while the second metal layer 7az was formed by sputtering of Cu and electroplating. Further, NiCr/Cu shows that the metal carbide layer 7ax and first metal layer 7ay were formed by sputtering of nichrome, while the second metal layer 7az was formed by sputtering of Cu and electroplating. Note that, the material forming the high heat resistance resin layer 6b is a polyimide resin.

In this figure, other than Example 30, the metal carbide layer 7ax and first metal layer 7ay are formed by sputtering of titanium. Further, Examples 24 to 26 are examples according to the first method, while Examples 27 to 30 are examples according to the second method. Comparative Examples 12 to 13 are examples in which the sputtering was carried out without exposure of the circuit board to the ambient air after the plasma treatment by argon plasma.

It is seen from this figure that, when the first metal is titanium, plasma treatment performed by nitrogen plasma (Examples 27 to 28) is preferred. The reason for this is guessed to be that titanium has a property of easily forming an oxide, therefore, if the nitrogen functional groups are large, the reactivity between the titanium and a cleaved portion of the resin can be raised while reducing the oxidation of the titanium.

Results of the XPS analysis concerning changes of the N/C and O/C in the case where the plasma treatment was carried out by nitrogen plasma and the sputtering was carried out without exposure of the board to the ambient air will be shown below.

FIG. 28 shows results of measurement of the ratio of numbers of atoms of the high heat resistance resin layers (6b) of the examples by XPS analysis in the same way as FIG. 25. Specifically, FIG. 28 shows the ratio of numbers of atoms, at the depth up to about 5 nm from the surface of the high heat resistance resin layer, obtained by firing X-rays at an angle of 20 degrees with respect to surfaces of the high heat resistance resin layers.

The meanings of the rows of "Calculating" and "Pristine" and their values are same as those in FIG. 25. The meaning and values of the row of "Ar plasma+atmosphere+NiCr sputtering" are same as the meaning and values of the row of "NiCr sputtering".

The row of "N$_2$ plasma+NiCr sputtering" shows the ratio of the numbers of atoms of the high heat resistance resin layer subjected to plasma treatment by nitrogen plasma, then subjected to the sputtering of NiCr without exposure to the ambient air. Namely, unlike the row of "Ar plasma+atmosphere+ NiCr sputtering", exposure to the ambient air is not carried out.

Note that, the conditions other than the plasma treatment and exposure to the ambient air (types of high heat resistance resin layers and conditions etc. of sputtering) relating to the row of "N$_2$ plasma+NiCr sputtering" are the same as the conditions of the row of "Ar plasma+atmosphere+NiCr sputtering".

In the rows of "Ar plasma+atmosphere+NiCr sputtering" and "N$_2$ plasma+NiCr sputtering" in FIG. 28, the ratios of O/C or N/C of these rows relative to the O/C or N/C in the row of "Pristine" are additionally described as % in parentheses.

As shown in this figure, when sputtering is carried out after plasma treatment by nitrogen plasma, both of the N/C and O/C are large. The O/C in this case is larger than the O/C in the case where exposure to the ambient air was carried out after the plasma treatment by argon plasma, and sputtering was carried out after that.

Specifically, in contrast to the case of argon plasma where the O/C and N/C become 378% and 55% compared with the case of non-treatment ("Pristine"), O/C and N/C become 478% and 181% in the case of nitrogen plasma compared with the case of the non-treatment.

The reason for the increase of O/C in the case of use of nitrogen plasma as well is considered to be that the H$_2$O contained in the resin is activated by the energy at the time of sputtering and reacts with the cleaved portions of the bonds due to the nitrogen plasma. Further, it is considered that O/C becomes larger than the case where argon plasma was used because this cleaved portions differ from those in the case where argon plasma was used.

When the plasma treatment is carried out by nitrogen plasma as described above, the nitrogen functional groups which decreased when the plasma treatment was carried out by Ar plasma can be increased, and oxygen functional groups can be generated in an amount larger than that in the case where the board is exposed to the ambient air after plasma treatment by Ar plasma, so realization of higher bonding between the resin and the metal is expected.

Figure 29A:
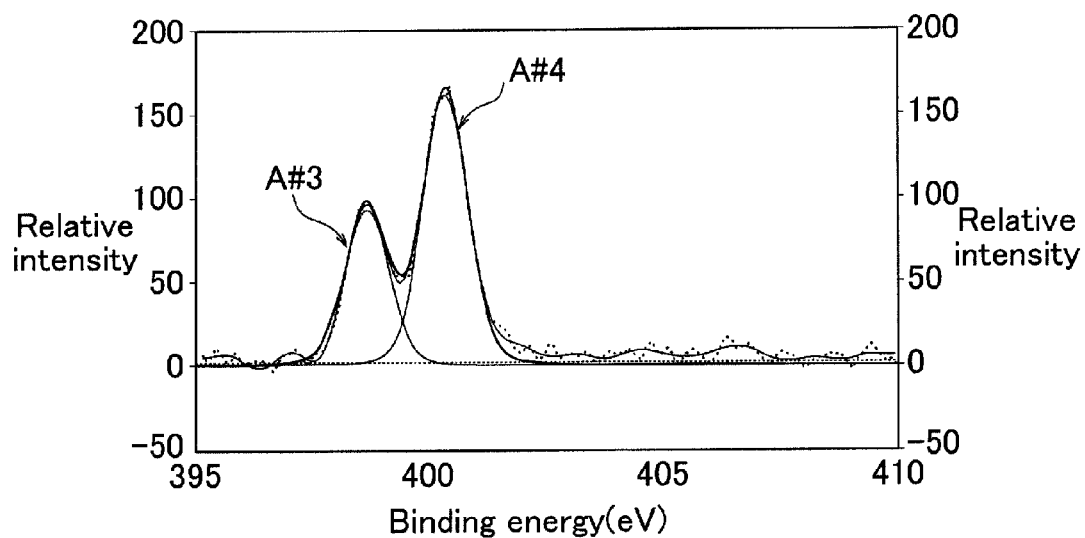
FIG. 29 A further view showing analysis results relating to structures of the resin layers of the embodiments of the present invention.
Figure 29B:
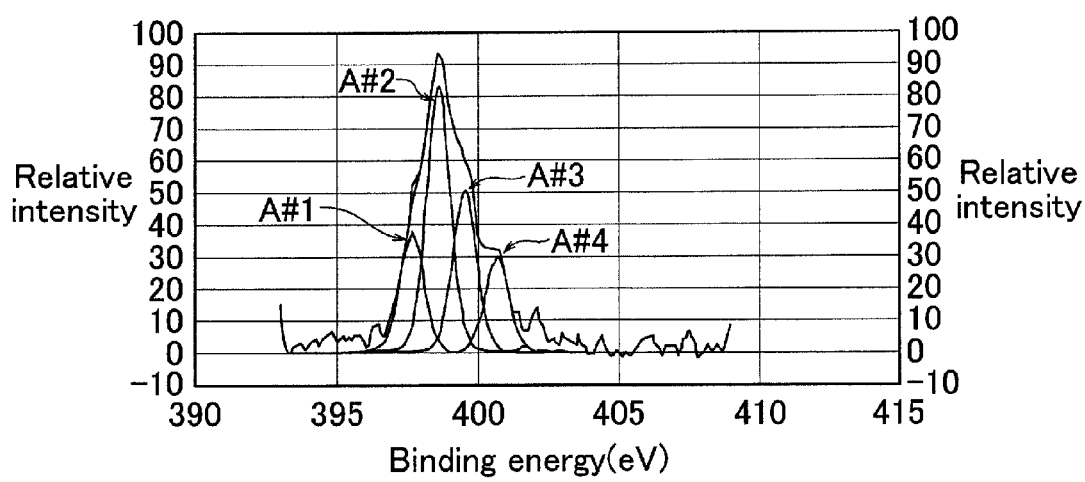

FIG. 29A shows an N1s spectrum of the resin corresponding to "Pristine" of FIG. 28, while FIG. 29B shows the N1s spectrum of the resin corresponding to "N$_2$ plasma+NiCr sputtering" in FIG. 28. The abscissas show the binding energies of the photoelectrons, while the ordinates show the relative intensities.

As shown in FIG. 29A, in the untreated state, two peaks indicated by A#3 and A#4 occur. A#3 corresponds to N—C, and A#4 corresponds to (N—C=O).

On the other hand, as shown in FIG. 29B, when the plasma treatment by nitrogen plasma and sputtering of NiCr are carried out, new peaks (A#1 and A#2) occur. A#1 corresponds to the peak by coordinate bonds between N—C and the metal, and A#2 corresponds to the peak by coordinate bonds between the imide and metal. Note that, it was confirmed from the XPS data of Cr and Ni that the metal was Cr.

When paying attention to the magnitude of the relative intensities, it is seen that the peak of A#2 has become larger in FIG. 29B. Further, it is seen from a comparison between FIG. 29A and FIG. 29B that the reduction of the peak of A#4 is large. In this way, it is considered that the influence of coordinate bonds between the imide and metal is large for bonding between the resin and metal in the case where plasma treatment by nitrogen plasma and sputtering are carried out.

Note that, values plotted on the abscissa (binding energy of photoelectrons) at peaks of A#1 to A#4 in FIG. 29B are A#1: 397.65, A#2: 398.59, A#3: 399.54, and A#4: 400.68.

Example 31

In the present example, a circuit board was fabricated. It was confirmed that a metal carbide was contained in the metal carbide layer of the first conductive layer.

First, a circuit board was fabricated according to the method of production explained above. Here, at the step of (12) explained above, after plasma treatment by argon plasma, the circuit board was exposed to the ambient air. Note that, the plasma treatment was carried out in the plasma system explained above under conditions of a pressure in the chamber of about 10 to 20 Pa, an output of 600 W, and a treatment time of 2 minutes. Further, at the steps of (13) and (14) explained above, the surface of the high heat resistance resin layer 6b, comprised of a polyimide benzoxazole resin, was sputtered with a nickel-chromium alloy under an output of 1200 W, a sputtering time of 120 seconds, and a temperature of 130° C. Further, sputtering of copper was carried out at the step of (15), and electroplating of copper was carried out at the step of (16).

As described above, a circuit board having a metal carbide layer containing a chromium carbide, a first metal layer comprised of a nickel-chromium alloy, and a second metal layer comprised of copper was fabricated.

Next, the cross-section obtained by cutting the circuit board in the up/down direction was checked by observation under a transmission electron microscope. The thickness of the metal carbide layer was 20 nm, and the thickness of the first metal layer was 50 nm.

Further, the first conductive layer of the circuit board was analyzed by Auger electron spectroscopy. Specifically, this was carried out as follows.

First, the second metal layer was etched off by an aqueous solution of sulfuric acid and hydrogen peroxide. Next, the first metal layer and metal carbide layer were analyzed while performing argon ion etching by using a SAM-670 model scanning type Auger electron spectroscopy apparatus made by PHI.

The AES measurement conditions were made an acceleration voltage of 3 kV, a sample voltage of 10 nA, a beam diameter of 100 nm or less, and a sample inclination angle of 72°. Further, the ion etching conditions were made an ion species of Ar+, an acceleration voltage of 2 kV, a sample inclination angle of 72°, and an etching rate ($SiO_2$ conversion value) of 4.5 nm/min.

Figure 23:
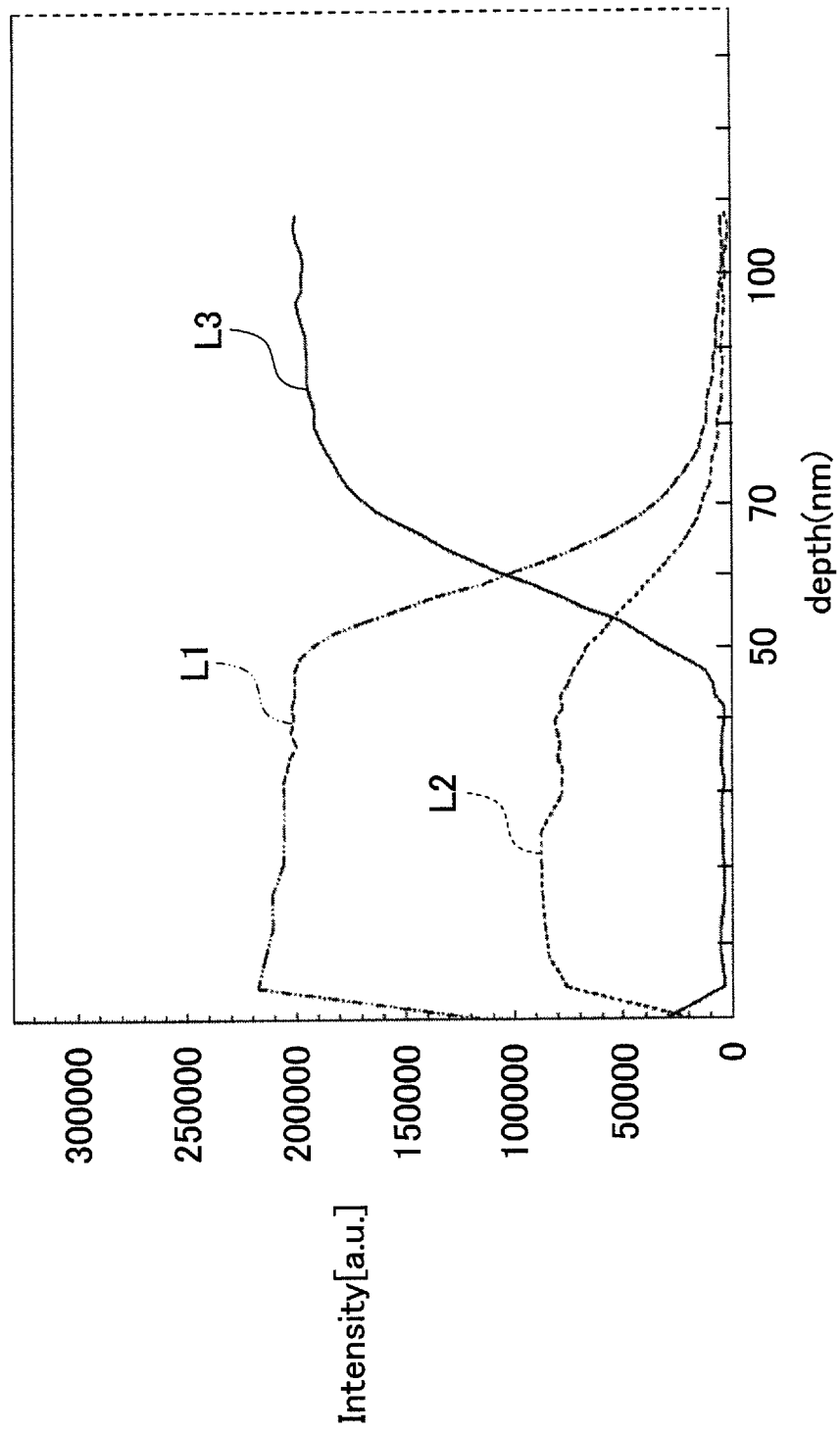
FIG. 23 A view showing analysis results of Example 31 of the present invention.
Figure 24:
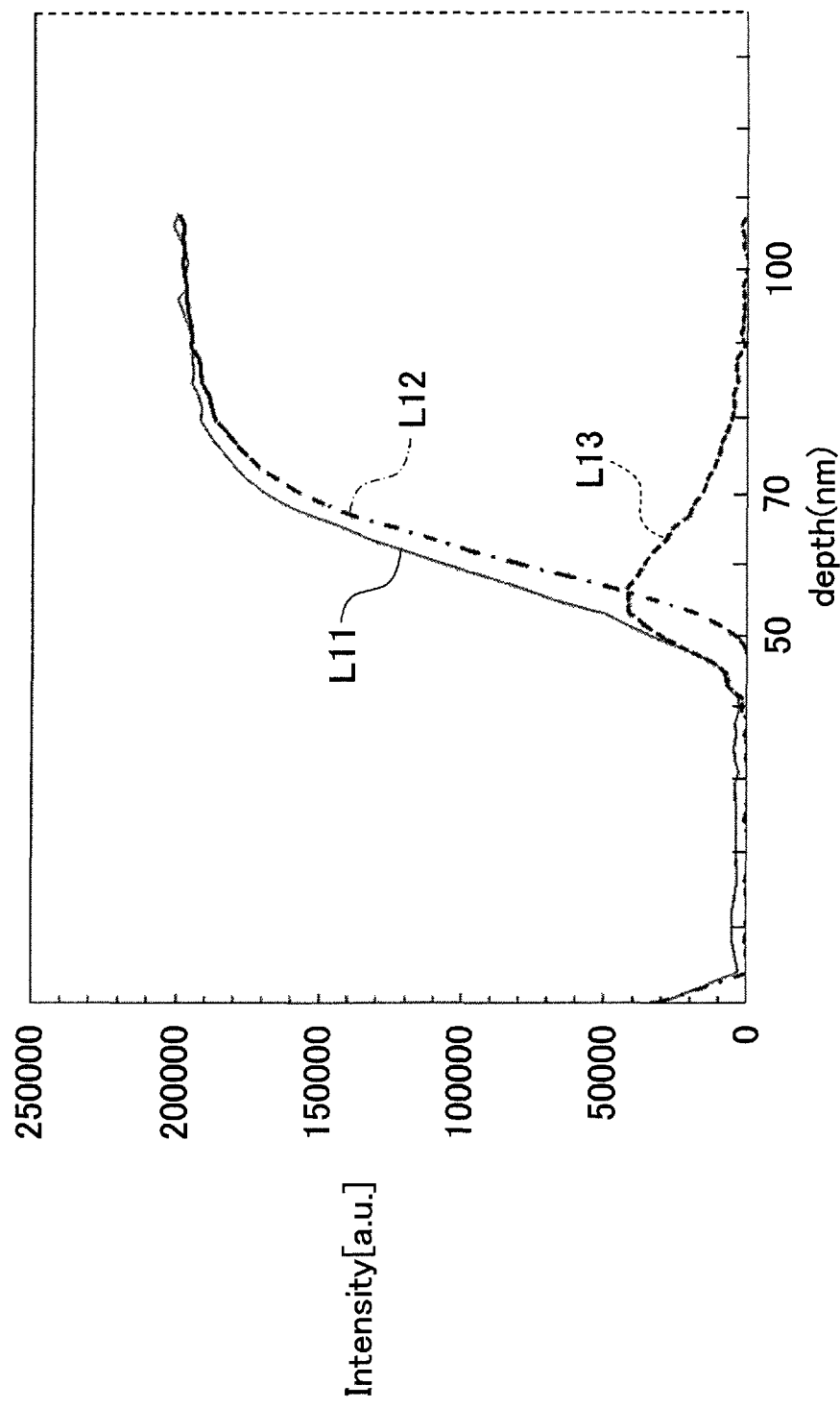
FIG. 24 Another view showing analysis results of Example 31 of the present invention.

The analysis results are shown in FIG. 23 and FIG. 24. In FIG. 23, an analysis specimen was separated to a nickel ingredient (a two dotted chain line L1 in the figures), a chromium ingredient (a dotted line L2 in the figures), a copper ingredient (not shown), a carbon ingredient (a solid line L3 in the figures), and an oxygen ingredient (not shown), the abscissa shows depths from the surface of the analysis specimen, and the ordinate relatively shows amounts of existence of the ingredients. Further, in FIG. 23, a region at the depth of 4 nm to less than 50 nm from the surface of the analysis specimen corresponds to the first metal layer, a region at the depth of 50 nm to less than 70 nm corresponds to the metal carbide layer, and a region at the depth of 70 nm or more corresponds to the resin layer.

Further, in FIG. 24, the carbon ingredient in FIG. 23 (a solid line L11 in the figure) is separated into an organic ingredient forming the resin molecules (a one dotted chain line L12 in the figure), and the carbide ingredient forming the metal carbide (a dotted line L13 in the figure).

As shown in FIG. 23, in the metal carbide layer, in comparison with the first metal layer, the chromium ingredient (first metal ingredient) and nickel ingredient were reduced and the carbon ingredient increased. Further, the deeper from the surface of the analysis specimen, the smaller the chromium ingredient and nickel ingredient and the larger the carbon ingredient. Further, as shown in FIG. 24, in the metal carbide layer, in comparison with the first metal layer and resin layer, the carbon ingredient increased, and the metal carbide was contained. Note that, the first metal layer had a mixed layer containing 2% or more metal carbide near the boundary between this and the metal carbide layer (region at the depth of 40 nm to less than 50 nm from the surface of the analysis specimen).

In this way, in the circuit board of the present embodiment, it could be confirmed that the metal carbide was contained in the metal carbide layer.

The invention claimed is:

1. A circuit board comprising:
   a resin layer; and
   a conductive layer which is formed on the resin layer, wherein
   the conductive layer has a metal carbide layer which contains a carbide of nickel-chromium alloy and which is bonded to the resin layer,
   the resin layer has a first region to which the metal carbide layer is bonded and a second region located at an inside of the resin layer from the first region, and
   the first region has a larger ratio of number of nitrogen atoms to a number of carbon atoms and a larger ratio of a number of oxygen atoms to a number of carbon atoms than the second region, and
   wherein the metal carbide layer is a compound in which the nickel-chromium alloy and a portion of the molecular chain of the resin contained in the resin layer are chemically bonded with each other.

2. The circuit board as set forth in claim 1, wherein the first region is set in thickness to 0.05% to 1.0% of a thickness of the resin layer.

3. The circuit board as set forth in claim 1, comprising:
   a plurality of insulating layers and conductor layers which are alternately stacked, wherein
   the resin layer is an uppermost layer of the insulating layers, and
   the conductive layer is an uppermost layer of the conductor layers, and
   only the uppermost layer of the conductor layers has the metal carbide layer.

4. The circuit board as set forth in claim 3, wherein a surface roughness at a surface of the resin layer to which the metal carbide layer is bonded is smaller than that at a surface of the insulating layer to which the conductor layer is bonded other than the conductive layer.

5. A circuit assembly comprising:
   the circuit board as set forth in claim 1 and
   an electronic component which is mounted on the circuit board and which is electronically connected to the conductive layer.

6. The circuit board of claim 1, wherein the conductive layer has a first metal layer in contact with the metal carbide layer and comprising the transition metal, and wherein a thickness of the first metal layer is larger than a thickness of the metal carbide layer.

* * * * *